(12) United States Patent
Hueda et al.

(10) Patent No.: US 11,005,571 B2
(45) Date of Patent: *May 11, 2021

(54) IMPAIRMENT COMPENSATION TECHNIQUES FOR HIGH PERFORMANCE COHERENT OPTICAL TRANSCEIVERS

(71) Applicant: INPHI CORPORATION, Santa Clara, CA (US)

(72) Inventors: Mario Rafael Hueda, Santa Clara, CA (US); José L. Correa Lust, Santa Clara, CA (US); Damian Alfonso Morero, Santa Clara, CA (US)

(73) Assignee: INPHI CORPORATION, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/892,146

(22) Filed: Jun. 3, 2020

(65) Prior Publication Data
US 2020/0295842 A1    Sep. 17, 2020

Related U.S. Application Data

(63) Continuation of application No. 16/256,637, filed on Jan. 24, 2019, now Pat. No. 10,715,259.
(Continued)

(51) Int. Cl.
*H04B 10/61* (2013.01)
*H04L 27/227* (2006.01)
(Continued)

(52) U.S. Cl.
CPC ........... *H04B 10/616* (2013.01); *H04B 10/40* (2013.01); *H04B 10/6161* (2013.01);
(Continued)

(58) Field of Classification Search
None
See application file for complete search history.

(56) References Cited

U.S. PATENT DOCUMENTS 8,761,609 B1 * 6/2014 Agazzi ............... H04B 10/6161
                                                        398/155
9,112,614 B2 * 8/2015 Randel ................. H04B 10/612
(Continued)

OTHER PUBLICATIONS

Junita et al., Hybrid Subcarrier Multiplexing Wavelength Division Multiplexing Using Laser and LED Spectral Slicing Architecture, 2012, IEEE (Year: 2012).*

*Primary Examiner* — Jai M Lee
(74) *Attorney, Agent, or Firm* — Richard T. Ogawa; Ogawa P.C.

(57) ABSTRACT

A method and structure for compensation techniques in coherent optical receivers. The present invention provides a coherent optical receiver with an improved 8×8 adaptive MIMO (Multiple Input, Multiple Output) equalizer configured within a digital signal processor (DSP) to compensate the effects of transmitter I/Q skew in subcarrier multiplexing (SCM) schemes. The 8×8 MIMO equalizer can be configured such that each of the 8 outputs is electrically coupled to 3 of 8 inputs, wherein each of the input-output couplings is configured as a filter. The method includes compensating for impairments to the digital conversion of an optical input signal via the 8×8 MIMO equalizer following other signal processing steps, such as chromatic dispersion (CD)/polarization-mode dispersion (PMD) compensation, carrier recovery, timing synchronization, and cycle slip correction.

18 Claims, 15 Drawing Sheets

Related U.S. Application Data

(60) Provisional application No. 62/621,521, filed on Jan. 24, 2018.

(51) Int. Cl.
  *H04L 27/38* (2006.01)
  *H04B 10/40* (2013.01)
  *H04J 14/02* (2006.01)

(52) U.S. Cl.
  CPC ..... *H04B 10/6162* (2013.01); *H04L 27/2275* (2013.01); *H04L 27/3836* (2013.01); *H04J 14/0298* (2013.01)

(56) References Cited

U.S. PATENT DOCUMENTS

| | | | | |
|---|---|---|---|---|
| 9,369,213 | B1* | 6/2016 | Kakande | H04L 25/03197 |
| 10,305,603 | B2* | 5/2019 | Dar | H04B 10/6163 |
| 10,715,259 | B1* | 7/2020 | Hueda | H04B 10/516 |
| 10,742,328 | B2* | 8/2020 | Wu | H04J 14/06 |
| 2002/0044322 | A1* | 4/2002 | Blumenthal | H04J 14/0298 |
| | | | | 398/147 |
| 2008/0240325 | A1* | 10/2008 | Agazzi | H04L 25/03038 |
| | | | | 375/371 |
| 2009/0304103 | A1* | 12/2009 | Vaidyanathan | H04B 7/0443 |
| | | | | 375/267 |
| 2010/0021163 | A1* | 1/2010 | Shieh | H04B 10/6162 |
| | | | | 398/65 |
| 2011/0310951 | A1* | 12/2011 | Cvijetic | H04L 25/03891 |
| | | | | 375/233 |
| 2013/0272704 | A1* | 10/2013 | Zamani | H04J 14/06 |
| | | | | 398/65 |
| 2014/0072307 | A1* | 3/2014 | Zamani | H04L 25/025 |
| | | | | 398/79 |
| 2014/0099116 | A1* | 4/2014 | Bai | H04B 10/6161 |
| | | | | 398/76 |
| 2014/0169501 | A1* | 6/2014 | Nazarathy | H03H 21/0012 |
| | | | | 375/316 |
| 2014/0186024 | A1* | 7/2014 | Randel | H04B 10/614 |
| | | | | 398/25 |
| 2015/0093119 | A1* | 4/2015 | Gorshtein | H04B 10/2569 |
| | | | | 398/159 |
| 2015/0256267 | A1* | 9/2015 | Randel | H04B 10/6161 |
| | | | | 398/208 |
| 2016/0112143 | A1* | 4/2016 | Yu | H04L 27/34 |
| | | | | 398/65 |
| 2016/0204871 | A1* | 7/2016 | Li | H04L 27/2601 |
| | | | | 398/183 |
| 2017/0141844 | A1* | 5/2017 | Sakamoto | G01J 1/16 |
| 2017/0250776 | A1* | 8/2017 | Morsy-Osman | H04J 14/06 |
| 2019/0081726 | A1* | 3/2019 | Rafique | H04B 10/616 |
| 2019/0268076 | A1* | 8/2019 | Awadalla | H04J 14/0298 |

* cited by examiner

IMPAIRMENT COMPENSATION TECHNIQUES FOR HIGH PERFORMANCE COHERENT OPTICAL TRANSCEIVERS

CROSS-REFERENCES TO RELATED APPLICATIONS

The present application claims priority to an incorporates by reference, for all purposes, the following U.S. nonprovisional patent application: U.S. Nonprovisional app. Ser. No. 16/256,637, filed on Jan. 24, 2019, which claims priority to U.S. provisional patent application: U.S. Provisional App. No. 62/621,521, filed on Jan. 24, 2018.

BACKGROUND OF THE INVENTION

The present invention relates to communication systems and integrated circuit (IC) devices. More particularly, the present invention provides for improved methods and devices for optical communication.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

Optical communication is one major technological area that is growing to address these high demands on data. Optical communication systems typically communicate data over a plurality of channels corresponding to different phases and/or polarizations of the optical signal. While the data communicated over the different channels is typically aligned relative to a common clock when transmitted by the transmitter, delay (or skew) may be introduced into one or more of the channels based on characteristics of the transmitter, receiver, and/or the optical fiber. As a result, the relative timing of the data in the various channels may be misaligned at the receiver, causing degradation of the recovered data.

Although there are several types of devices and methods related to optical communication systems, they have been inadequate for the advancement of various applications. Conventional embodiments consume large areas or large amounts of power and suffer from performance limitations. Therefore, improved devices and methods for optical communication systems and related electronics are highly desired.

BRIEF SUMMARY OF THE INVENTION

The present invention relates to communication systems and integrated circuit (IC) devices. More particularly, the present invention provides for improved methods and devices for optical communication.

According to an example, the present invention a provides a structure and method for an improved 8×8 adaptive equalizer to compensate the effects of transmitter I/Q skew in subcarrier multiplexing (SCM) schemes. Based on investigations of the performance and complexity of the compensator for the transmitter I/Q skew and quadrature error in SCM systems, we derive a reduced complexity 8×8 adaptive equalizer for compensating transmitter I/Q imbalance and skew. We find that the complexity of the 8×8 adaptive equalizer can be reduced ~4 times or more compared to prior equalizers without any impact on the receiver performance. Furthermore, we demonstrate that the phase and gain imbalance of the modulator (Tx) cannot be completely compensated at the receiver without amplifying the channel noise.

In an example, the present invention provides a multi-subcarrier coherent optical receiver device. The device includes a front-end module configured to receive an input signal; an analog-to-digital converter (ADC) electrically coupled to the front-end module; and a digital signal processor (DSP) electrically coupled to the ADC. The DSP can includes a chromatic dispersion (CD)/polarization-mode dispersion (PMD) equalizer module, a carrier recovery module, a cycle slip correction module, a timing synchronization module; and a reduced complexity 8×8 MIMO (Multiple-Input, Multiple-Output) equalizer. This equalizer is configured such that each of the 8 outputs is electrically coupled to 3 of the 8 inputs, wherein each of the input-output couplings is configured as a filter. In a specific example, the reduced complexity equalizer architecture is characterized by 24 digital filters. In a specific example, 1 of the 3 output-input couplings of each of the 8 outputs in the 8×8 MIMO equalizer consists of 1 tap (resulting in the equalizer being characterized by 16 digital filters).

In an example, the present invention provides a method of impairment compensation in a coherent optical receiver device. The method includes receiving, by a front-end module, an optical input signal; converting, by an analog-to-digital converter (ADC) electrically coupled to the front-end module, the optical input signal to a digital input signal; and processing, by a digital signal processor (DSP) electrically coupled to the ADC, the digital input signal. The method also includes compensating, by an 8×8 MIMO equalizer within the DSP configured such that each of the 8 outputs is electrically coupled to 3 of the 8 inputs, wherein each of the input-output couplings is configured as a filter, the digital input signal. The processing by the DSP can also include processing via the PMD equalizer module, the carrier recovery module, the cycle slip correction module, and the timing synchronization module. Other variations, modifications, and alternatives will be recognized by those of ordinary skill in the art.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention the presently described embodiments and the presently understood best mode of the invention are described with additional detail through the use of the accompanying drawings in which.

DETAILED DESCRIPTION OF THE INVENTION

Figure 1:
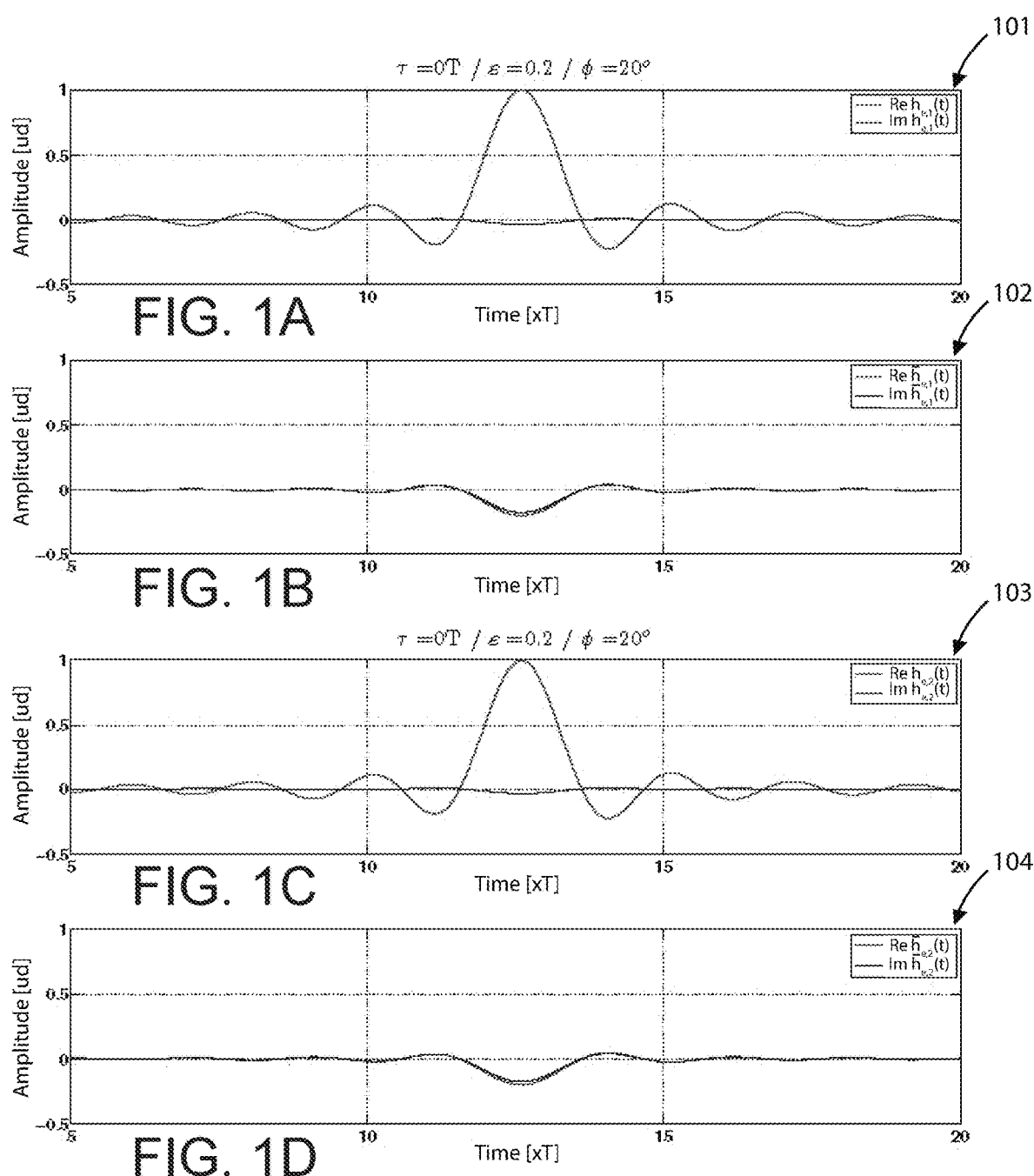
FIGS. 1A-1D are sample graphs illustrating simulation channel responses according to examples of the present invention.
Figure 2:
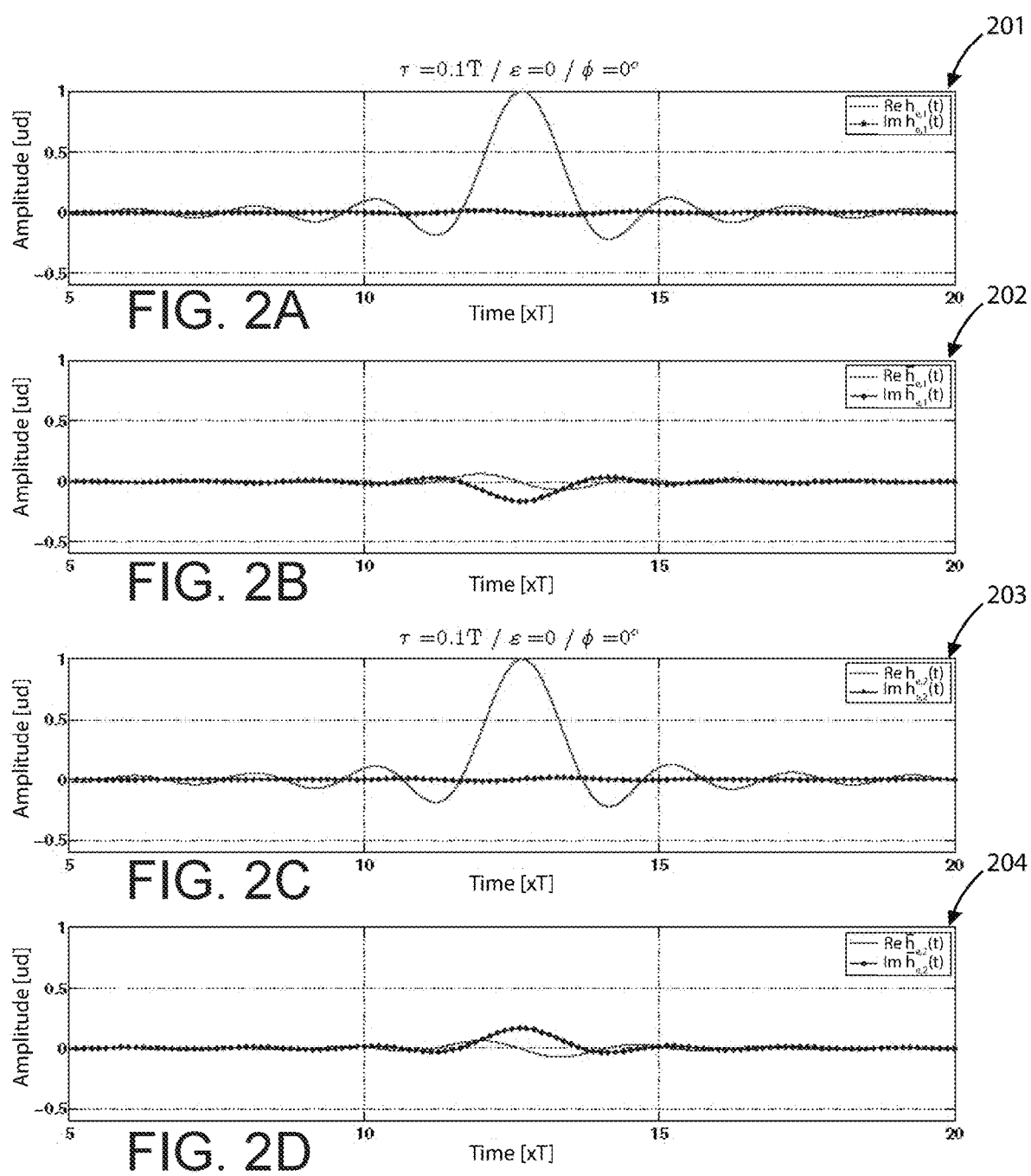
FIGS. 2A-2D are sample graphs illustrating simulation channel responses according to examples of the present invention.
Figure 3:
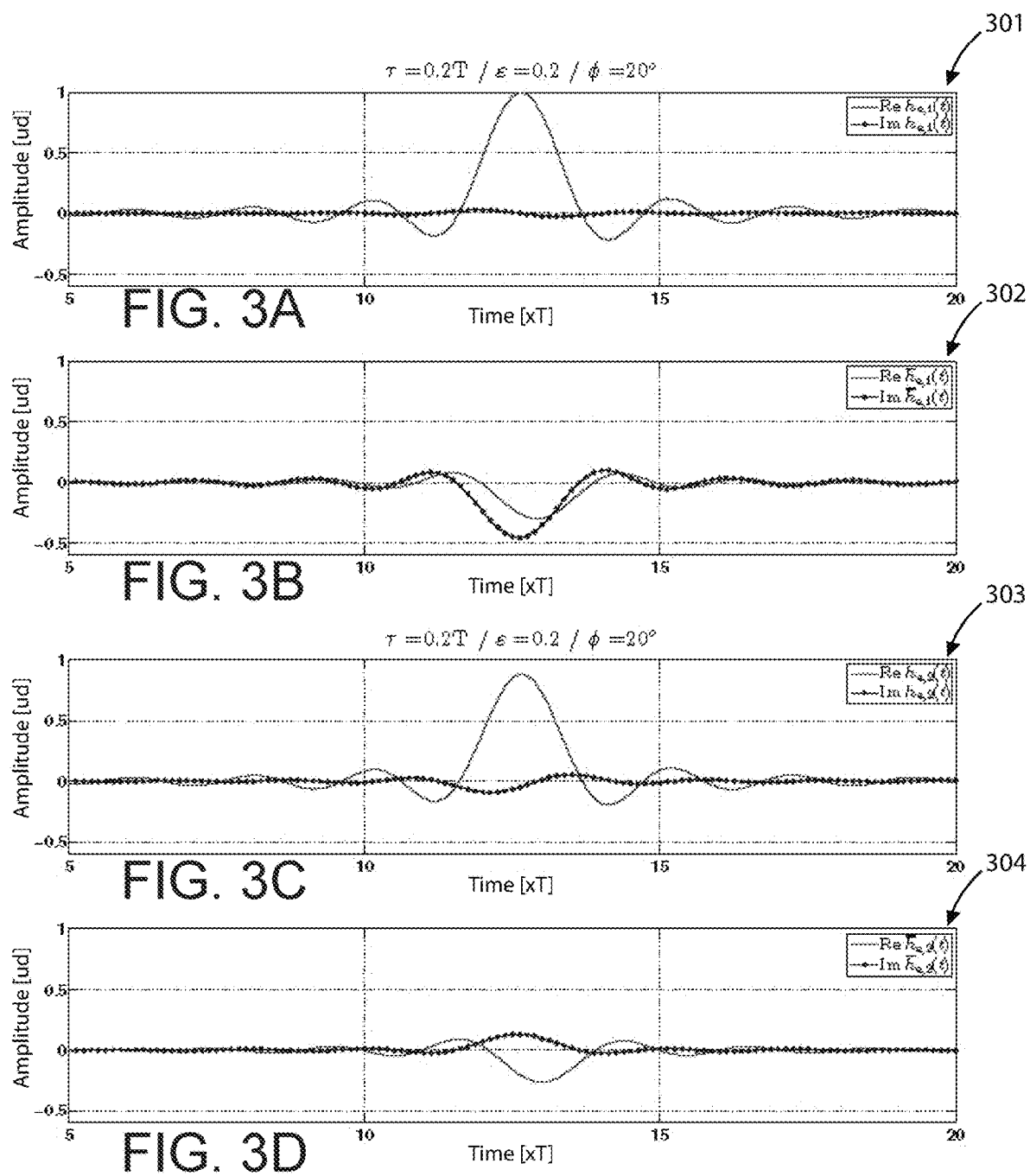
FIGS. 3A-3D are sample graphs illustrating simulation channel responses according to examples of the present invention.

The present invention relates to communication systems and integrated circuit (IC) devices. More particularly, the present invention provides for improved methods and devices for optical communication.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

I. Overview

Subcarrier multiplexing (SCM) optical systems have been found to show robustness against non-linear effects. The impact of such impairments, including in-phase and quadrature (I/Q) skew and quadrature error, is significant and can be even more severe in multi-subcarrier systems when compared to single-subcarrier system. This is because single-subcarrier techniques for polarization recovery and I/Q skew compensation can introduce signal distortions in multi-subcarrier systems leading to signal degradation. Various equalizer architectures have been proposed, including an 8×8 real-valued equalizer that avoids such signal distortions. However, the conventional architecture of the 8×8 equalizer is highly complex, requiring each output to be connected with all inputs (i.e., equivalent to 8×8=64 digital filters).

According to an example, the present invention a provides an improved 8×8 adaptive equalizer to compensate the effects of transmitter I/Q skew in SCM schemes. Based on investigations of the performance and complexity of the compensator for the transmitter I/Q skew and quadrature error in SCM systems, we derive a reduced complexity 8×8 adaptive equalizer for compensating transmitter I/Q imbalance and skew. We find that the complexity of the 8×8 adaptive equalizer can be reduced ~4 times or more compared to prior equalizers without any impact on the receiver performance. Furthermore, we demonstrate that the phase and gain imbalance of the modulator (Tx) cannot be completely compensated at the receiver without amplifying the channel noise.

II. Impact of I/Q Skew on the SCM Signal

Let $s_1(t)$ and $s_2(t)$ be the baseband signal for subcarrier 1 and 2, respectively, given by the following:

$$s_1(t) = \sum_k (a_{k,1}x + b_{k,1}y)g(t-kT) \quad (1)$$

$$s_2(t) = \sum_k (a_{k,2}x + b_{k,2}y)g(t-kT) \quad (2)$$

where $a_{k,i}$ and $b_{k,i}$ are the complex symbols for both polarizations of carrier i with i ∈ {1,2}, g(t) is the impulse response of the transmit filter, x and y are vectors for both polarizations, and T is the symbol period at each subcarrier.

The transmit SCM signal can be written as follows:

$$s(t)=s_1(t)e^{j\omega_c t}+s_2(t)e^{-j\omega_c t} \quad (3)$$

where $\pm\omega_c$ are the angular frequencies of the subcarriers.

Consider that an I/Q skew is added before the optical modulator. Then, it is possible to show that the resulting signal is as follows:

$$y(t)=s(t)\otimes b(t)+s^*(t)\overline{b}(t) \quad (4)$$

where $\otimes$ denotes convolution, and b(t) and $\overline{b}$(t) are as follows:

$$b(t)=\tfrac{1}{2}[\delta(t+\tau/2)+\delta(t-\tau/2)] \quad (5)$$

$$\overline{b}(t)=\tfrac{1}{2}[\delta(t+\tau/2)+\delta(t-\tau/2)] \quad (6)$$

with $\tau$ being the I/Q skew introduced at the transmitter.

Then, the modulator introduces quadrature error resulting in the following:

$$r(t)=\alpha y(t)+\beta y^*(t) \quad (7)$$

where $\alpha$ and $\beta$ are as follows:

$$\alpha=\tfrac{1}{2}[(1-\epsilon)e^{j\phi/2}+(1+\epsilon)e^{-j\phi/2}] \quad (8)$$

$$\beta=\tfrac{1}{2}[(1-\epsilon)e^{-j\phi/2}+(1-\epsilon)e^{j\phi/2}] \quad (9)$$

with $\phi$ and $\epsilon$ being the phase and amplitude imbalance, respectively (note: both $\phi$ and $\epsilon$ are real numbers). Operating further, we get the following:

$$r(t)=s(t)\otimes f(t)+s^*(t)\otimes \overline{f}(t) \quad (10)$$

where f(t) and $\overline{f}$(t) are as follows:

$$f(t)=\alpha b(t)+\beta \overline{b}(t) = \frac{(\alpha+\beta)}{2}\delta(t+\tau/2)+\frac{(\alpha-\beta)}{2}\delta(t-\tau/2) \quad (11)$$

$$\overline{f}(t)=\alpha \overline{b}(t)+\beta b(t) = \frac{(\alpha+\beta)}{2}\delta(t+\tau/2)-\frac{(\alpha-\beta)}{2}\delta(t-\tau/2) \quad (12)$$

The first term in equation (10) can be expressed as follows:

$$s(t)\otimes f(t)=s_1(t)e^{j\omega_c t}\otimes f(t)+s_2(t)e^{-j\omega_c t}\otimes f(t)= \quad (13)$$

$$e^{j\omega_c t}\sum_k (a_{k,1}x+b_{k,1}y)h_{e,1}(t-kT)+$$

$$e^{-j\omega_c t}\sum_k (a_{k,2}x+b_{k,2}y)h_{e,2}(t-kT)$$

where $h_{e,1}(t)$ and $h_{e,2}(t)$ are the baseband equivalent channel responses given by the following:

$$h_{e,1}(t)=g(t)\otimes f(t)e^{j\omega_c t} \quad (14)$$

$$h_{e,2}(t)=g(t)\otimes f(t)e^{j\omega_c t} \quad (15)$$

Similarly, the second term in equation (10) can be expressed as follows:

$$s^*(t)\otimes \overline{f}(t)=s_1^*(t)e^{-j\omega_c t}\otimes \overline{f}(t)+s_2^*(t)e^{j\omega_c t}\otimes \overline{f}(t)= \quad (16)$$

$$e^{-j\omega_c t}\sum_k (a_{k,1}^*x+b_{k,1}^*y)\overline{h}_{e,1}(t-kT)+$$

$$e^{j\omega_c t}\sum_k (a_{k,2}^*x+b_{k,2}^*y)\overline{h}_{e,2}(t-kT)$$

where $\overline{h}_{e,1}(t)$ and $\overline{h}_{e,2}$(t) are given by the following:

$$\overline{h}_{e,1}(t)=g(t)\otimes \overline{f}(t)e^{j\omega_c t} \quad (17)$$

$$\overline{h}_{e,2}(t)=g(t)\otimes \overline{f}(t)e^{-j\omega_c t} \quad (18)$$

The received signal r(t) given by (17) is demodulated by two carriers $e^{\pm j\omega_c t}$ and filtered by a low pass filter to get two baseband signals, $r_1$(t) and $r_2$(t). From (23) and (26) we can obtain the following:

$$r_1(t)=\sum_k (a_{k,1}x+b_{k,1}y)h_{e,1}(t-kT)+\sum_k (a_{k,2}^*x+b_{k,2}^*y)\overline{h}_{e,2}(t-kT) \quad (19)$$

$$r_2(t)=\sum_k (a_{k,2}x+b_{k,2}y)h_{e,2}(t-kT)+\sum_k (a_{k,1}^*x+b_{k,1}^*y)\overline{h}_{e,1}(t-kT) \quad (20)$$

Further operations results in the following:

$$r_1(t)=x\sum_k a_{k,1}h_{e,1}(t-kT)+a_{k,2}^*\overline{h}_{e,2}(t-kT)+ \quad (21)$$

$$y\sum_k b_{k,1}h_{e,1}(t-kT)+b_{k,2}^*\overline{h}_{e,2}(t-kT)=r_{1,x}(t)x+r_{1,y}(t)y$$

$$r_2(t)=x\sum_k a_{k,2}h_{e,2}(t-kT)+a_{k,1}^*\overline{h}_{e,1}(t-kT)+ \quad (22)$$

$$y\sum_k b_{k,2}h_{e,2}(t-kT)+b_{k,1}^*\overline{h}_{e,1}(t-kT)=r_{2,x}(t)x+r_{2,y}(t)y$$

where $r_{1,x}(t)$, $r_{1,y}(t)$, $r_{2,x}(t)$, and $r_{2,y}(t)$ are as follows:

$$r_{1,x}(t)=\sum_k a_{k,1}h_{e,1}(t-kT)+a_{k,2}^*\overline{h}_{e,2}(t-kT) \quad (23)$$

$$r_{1,y}(t)=\sum_k b_{k,1}h_{e,1}(t-kT)+b_{k,2}^*\overline{h}_{e,2}(t-kT) \quad (24)$$

$$r_{2,x}(t)=\sum_k a_{k,2}h_{e,2}(t-kT)+a_{k,1}^*\overline{h}_{e,1}(t-kT) \quad (25)$$

$$r_{2,y}(t)=\sum_k b_{k,2}h_{e,2}(t-kT)+b_{k,1}^*\overline{h}_{e,1}(t-kT) \quad (26)$$

Through the above operations, it is determined that the transmit I/Q skew does not combine the polarizations. Therefore, each output of an 8×8 MIMO equalizer, for example, does not depend on all of the inputs, i.e., to compensate for the Tx mismatches, one polarization of Carrier 1 (e.g., $r_{1,x}$(t)) just needs information from one polarization of Carrier 2 (e.g., $r_{2,x}$(t)). Also, unlike in the single carrier case, the quadrature error caused by the Tx modulator does not introduce correlation between I/Q of a given polarization. Note that $r_{1,x}$(t) is independent of $a^*_{k,1}$; it only depends on $\alpha_{k,1}$. The effect of this relationship in SCM receivers is similar to one caused by an I/Q skew.

III. Analysis of Quadrature Error and I/Q Skew Cases

The following presents three cases that address the impact of Quadrature Error, I/Q Skew, and the combination of both, respectively. Each of these cases are discussed under certain variable constraints, which are further described below.

A. Case 1: Impact of Quadrature Error ($\tau=0$)

In the absence of I/Q skew (i.e., $\tau=0$), the following can be determined:

$$f(t)=\alpha\delta(t) \quad (5)$$

$$\bar{f}(t)=\beta\delta(t)$$

Since $f(t)e^{\pm j\omega_c t}=\alpha\delta(t)$ and $\bar{f}(t)e^{\pm j\omega_c t}=\beta\delta(t)$, the following can be determined:

$$h_{e,1}(t)=h_{e,2}(t)=\alpha g(t)$$

$$\bar{h}_{e,1}(t)=\bar{h}_{e,2}(t)=\beta g(t)$$

FIGS. 1A-1D are sample graphs illustrating simulation channel responses according to examples of the present invention. More specifically, graphs 101-104 show simulation responses under the following criteria: $\tau=0T$, $\epsilon=0.2$, and $\phi=20°$. These results confirm the predictions previously discussed.

Next, we evaluate the impact and compensation of the quadrature error on the receiver. Assuming that $g(t)$ is an ISI-free pulse, we can verify that the baud rate samples of the signals for a same polarization of both subcarriers result as follows:

$$r_{1,x}(n)=\alpha\alpha_{n,1}+\beta\alpha^*_{n,2} \quad (27)$$

$$r_{2,x}(n)=\alpha\alpha_{n,2}+\beta\alpha^*_{n,1} \quad (28)$$

Note that $\alpha_{n,1}$ and $\alpha^*_{n,2}$ can be detected (instead of $\alpha_{n,2}$) by considering the equivalent system as follows:

$$r_{1,x}(n)=\alpha\alpha_{n,1}+\beta\alpha^*_{n,2} \quad (29)$$

$$r^*_{2,x}(n)=\alpha^*\alpha_{n,2}+\beta^*\alpha_{n,1} \quad (30)$$

Thus, the baud-rate samples can be rewritten as follows:

$$\begin{bmatrix} r_{1,x}(n) \\ r^*_{2,x}(n) \end{bmatrix} = M_{\phi,\epsilon} \begin{bmatrix} a_{1,n} \\ a^*_{2,n} \end{bmatrix} \quad (31)$$

where $M_{\phi,\epsilon}$ is as follows:

$$M_{\phi,\epsilon} = \begin{bmatrix} \alpha & \beta \\ \beta^* & \alpha^* \end{bmatrix} \quad (32)$$

To compensate for the quadrature error at the receiver in order to obtain $\alpha_{1,n}$ and $\alpha^*_{2,n}$ (i.e., $\alpha_{2,n}$), a linear transformation based on this matrix is applied as follows:

$$M_{\phi,\epsilon}^{-1} = \frac{1}{\det(M_{\phi,\epsilon})} Adj(M_{\phi,\epsilon}) = \frac{1}{|\alpha|^2-|\beta|^2}\begin{bmatrix} \alpha^* & -\beta \\ -\beta^* & \alpha \end{bmatrix} \quad (33)$$

Then, the power of the noise added after the Tx modulator will be amplified by a factor F, determined as follows:

$$F = \frac{|\alpha|^2+|\beta|^2}{(|\alpha|^2-|\beta|^2)^2} = \frac{1+\epsilon^2}{(1-\epsilon^2)^2} \times \frac{1}{\cos^2(\phi)} \quad (34)$$

where $$\frac{1+\epsilon^2}{(1-\epsilon^2)^2}$$

represents the impact of gain and $$\frac{1}{\cos^2(\phi)}$$

represents the impact of phase imbalance. Note: it is possible to show that $|\alpha|^2+|\beta|^2=1+\epsilon^2$ while $|\alpha|^2-|\beta|^2=(1-\epsilon^2)\cos(\phi)$.

In summary, the quadrature error of the modulator (Tx) in SCM systems cannot be perfectly compensated at the receiver side and a degradation of the signal-to-noise ratio (SNR) of $\geq \log_{10}(F)$ [dB] will result. Thus, the present invention considers a linear transformation at the Tx to mitigate the fundamental degradation experienced at the Rx.

B. Case 2: Impact of I/Q Skew ($\epsilon=0$ and $\phi=0$)

In this case, we get the following:

$$f(t)=\tfrac{1}{2}[\delta(t+\tau/2)+\delta(t-\tau/2)]$$

$$\bar{f}(t)=\tfrac{1}{2}[\delta(t+\tau/2)-\delta(t-\tau/2)]$$

Taking into account that $g(t)$ is a real pulse, we obtain the following:

$$h_{e,1}(t)=\tfrac{1}{2}[e^{j\omega_c\tau/2}g(t+\tau/2)+e^{-j\omega_c\tau/2}g(t-\tau/2)]$$

$$h_{e,2}(t)=\tfrac{1}{2}[e^{-j\omega_c\tau/2}g(t+\tau/2)+e^{j\omega_c\tau/2}g(t-\tau/2)]=h^*_{e,1}(t)$$

$$\bar{h}(t)=\tfrac{1}{2}[e^{-j\omega_c\tau/2}g(t+\tau/2)-e^{j\omega_c\tau/2}g(t-\tau/2)]$$

$$\bar{h}_{e,2}(t)=\tfrac{1}{2}[e^{j\omega_c\tau/2}g(t+\tau/2)-e^{-j\omega_c\tau/2}g(t-\tau/2)]=\bar{h}^*_{e,1}(t)$$

When $\tau$ is small (e.g., $|\tau|<0.2T$), the result is the following:

$$h_{e,1}(t)=h_{e,2}(t)\approx\cos(\omega_c\tau/2)g(t) \quad (35)$$

$$\bar{h}_{e,1}(t)=\bar{h}_{e,2}(t)\approx -j\sin(\omega_c\tau/2)g(t) \quad (36)$$

FIGS. 2A-2D are sample graphs illustrating simulation channel responses according to examples of the present invention. More specifically, graphs 201-204 show simulation responses under the following criteria: $\tau=0.1T$, $\epsilon=0$, and $\phi=0$. Again, these results confirm the predictions previously discussed.

In order to provide a simple approach to determining the impact of Tx I/Q skew on receiver performance, we consider the same example used previously in Section VI.A. Based on equations (35) and (36), it is possible to show the following:

$$\begin{bmatrix} r_{1,x}(n) \\ r^*_{2,x}(n) \end{bmatrix} = M_\tau \begin{bmatrix} a_{1,n} \\ a^*_{2,n} \end{bmatrix} \quad (37)$$

where $M_\tau$ is as follows:

$$M_\tau = \begin{bmatrix} \cos(\omega_c\tau/2) & j\sin(\omega_c\tau/2) \\ j\sin(\omega_c\tau/2) & \cos(\omega_c\tau/2) \end{bmatrix} \quad (38)$$

Since $M_\tau$ is a unitary matrix with a determinant of one, the effect of the I/Q skew could be perfectly compensated at the receiver. This result is derived from Equations (35) and (36), both which assume that the ISI of the channel pulses is negligible. As will be shown later, the accuracy of this approach is satisfactory for QPSK, however it degrades for QAM16.

C. Case 3: Impact of I/Q Skew and Quadrature Error ($\epsilon=0$ and $\phi=0$)

Similar to the above method, it is possible to show the following:

$$h_{e,1}(t) = \frac{(\alpha+\beta)}{2}e^{j\omega_c\tau/2}g(t+\tau/2) + \frac{(\alpha-\beta)}{2}e^{-j\omega_c\tau/2}g(t-\tau/2)$$

$$h_{e,2} = \frac{(\alpha+\beta)}{2}e^{-j\omega_c\tau/2}g(t+\tau/2) + \frac{(\alpha-\beta)}{2}e^{j\omega_c\tau/2}g(t-\tau/2)$$

$$\bar{h}_{e,1}(t) = \frac{(\alpha+\beta)}{2}e^{-j\omega_c\tau/2}g(t+\tau/2) - \frac{(\alpha-\beta)}{2}e^{j\omega_c\tau/2}g(t-\tau/2)$$

$$\bar{h}_{e,2}(t) = \frac{(\alpha+\beta)}{2}e^{j\omega_c\tau/2}g(t+\tau/2) - \frac{(\alpha-\beta)}{2}e^{-j\omega_c\tau/2}g(t-\tau/2)$$

Since $\alpha$ and $\beta$ are complex numbers in general, note that $|h_{e,1}(t)| \neq |h_{e,2}(t)|$ and $|\bar{h}_{e,1}(t)| \neq |\bar{h}_{e,2}(t)|$.

FIGS. 3A-3D are sample graphs illustrating simulation channel responses according to examples of the present invention. More specifically, graphs 301-304 show equivalent baseband channel responses from simulations under the following criteria: $\tau=0.2T$, $\epsilon=0.2$, and $\phi=20°$. Unlike the previous examples, there are important differences between the magnitude of the responses $\bar{h}_{e,1}(t)$ and $\bar{h}_{e,2}(t)$. This shows that the impact of the combined effects of quadrature error and I/Q skew on performance should be different in both channels.

When $\tau$ is small (e.g., $|\tau|<0.2T$), it is possible to show the following:

$$\begin{bmatrix} r_{1,x}(n) \\ r_{2,x}^*(n) \end{bmatrix} = M_{\phi,\epsilon}M_\tau \begin{bmatrix} a_{1,n} \\ a_{2,n}^* \end{bmatrix} \quad (39)$$

where $M_{\phi,\epsilon}$ and $M_\tau$ are given by Equations (32) and Equation (38), respectively. Therefore, previous observations are still valid in the presence of the combined effects of I/Q skew and quadrature errors (e.g., the I/Q skew could be perfectly compensated at the receiver).

IV. Reduced Complexity I/Q Skew Compensator

In order to compensate for the effects of the I/Q skew and quadrature error introduced on the transmitter side of SCM schemes, an 8×8 MIMO equalizer operating at symbol rate can be implemented. Such an equalizer can be used after chromatic dispersion (CD) and polarization module dispersion (PMD) equalization, carrier recovery, timing synchronization, and cycle slip correction are achieved on the DSP. Such an equalizer has 8×8=64 filters of N taps in the time domain. The operation can be expressed as follows:

$$\begin{bmatrix} s_{x_i,1} \\ s_{x_q,1} \\ s_{y_i,1} \\ s_{y_q,1} \\ s_{x_i,2} \\ s_{x_q,2} \\ s_{y_i,2} \\ s_{y_q,2} \end{bmatrix} = \begin{bmatrix} f_{11} & f_{12} & f_{13} & f_{14} & f_{15} & f_{16} & f_{17} & f_{18} \\ f_{21} & f_{22} & f_{23} & f_{24} & f_{25} & f_{26} & f_{27} & f_{28} \\ f_{31} & f_{32} & f_{33} & f_{34} & f_{35} & f_{36} & f_{37} & f_{38} \\ f_{41} & f_{42} & f_{43} & f_{44} & f_{45} & f_{46} & f_{47} & f_{48} \\ f_{51} & f_{52} & f_{53} & f_{54} & f_{55} & f_{56} & f_{57} & f_{58} \\ f_{61} & f_{62} & f_{63} & f_{64} & f_{65} & f_{66} & f_{67} & f_{68} \\ f_{71} & f_{72} & f_{73} & f_{74} & f_{75} & f_{76} & f_{77} & f_{78} \\ f_{81} & f_{82} & f_{83} & f_{84} & f_{85} & f_{86} & f_{87} & f_{88} \end{bmatrix} \otimes \begin{bmatrix} r_{x_i,1} \\ r_{x_q,1} \\ r_{y_i,1} \\ r_{y_q,1} \\ r_{x_i,2} \\ r_{x_q,2} \\ r_{y_i,2} \\ r_{y_q,2} \end{bmatrix} \quad (40)$$

where $\otimes$ denotes sum of convolution and $f_{ij}$ is the impulse response of the equalizer corresponding to the i-th output due to the j-th input.

As explained in previous sections, the output for each lane is observed to be dependent on the input for the same lane and the inputs for the lanes on the other sub channel corresponding to the same polarization. According to an example of the present invention, this means that the output for each lane depends only on three lane inputs, i.e., a total of 3×8=24 filters of N taps, which significantly reduces the complexity compared to other approaches, e.g., 64 filters of the same length.

Figure 4:
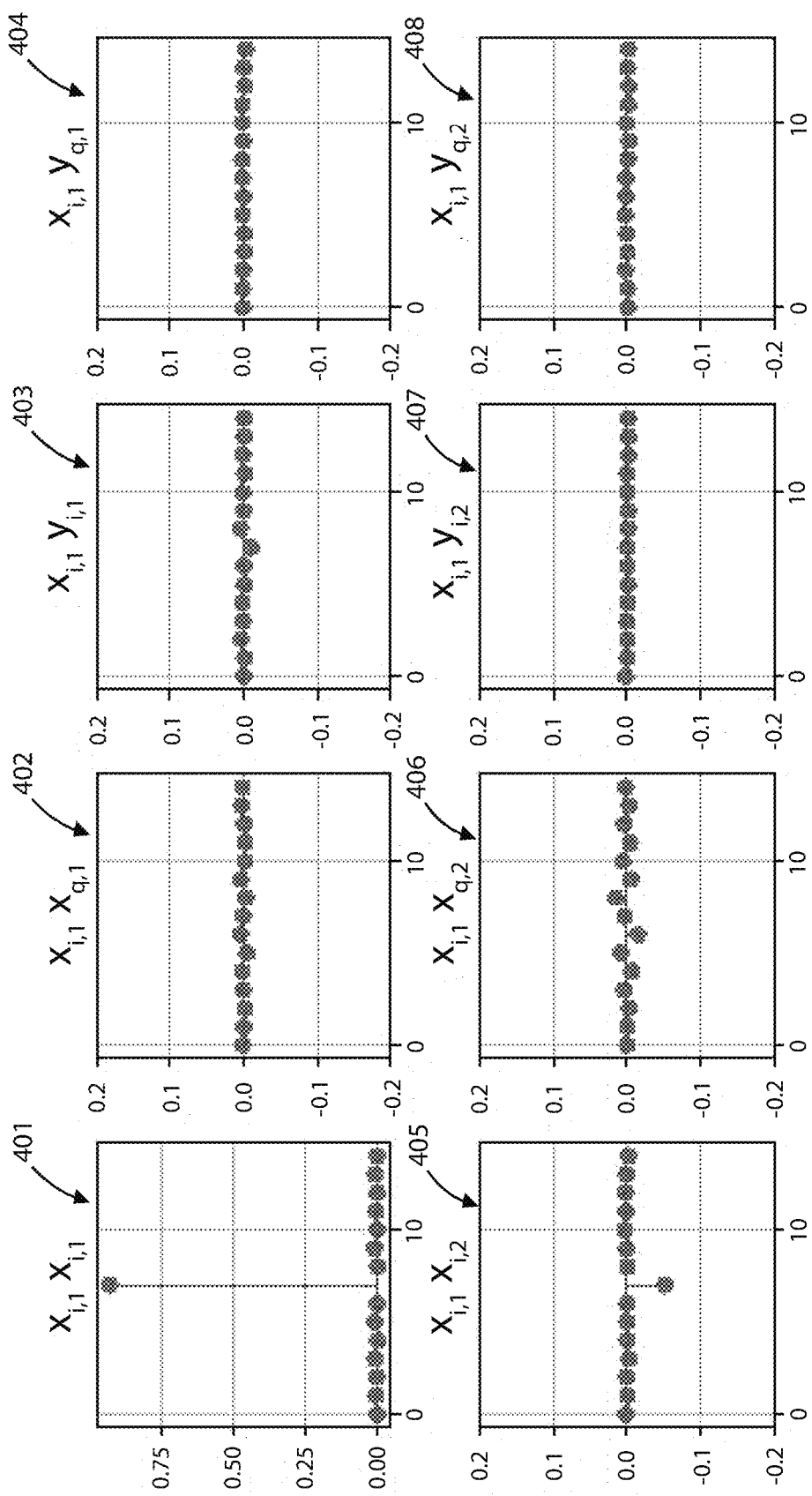
FIG. 4 is a compilation of sample graphs illustrating filter responses according to examples of the present invention.

FIG. 4 is a compilation of sample graphs illustrating filter responses according to examples of the present invention. More specifically, graphs 401-408 show filter responses from equalizer taps with N=15 for QAM16 with 1 ps of I/Q skew at an aggregate symbol rate of 66 GBd (2×33 GBd). For example, these graphs show that only lanes $x_{i,2}$ and $x_{q,2}$ of Channel 2 contribute to the output of $x_{i,1}$ of Channel 1. Moreover, the filter responses on the principal diagonal are impulses, i.e., only a delay line. Thus, in an example of the present invention, the I/Q compensator reduces to the following:

$$\begin{bmatrix} s_{x_i,1} \\ s_{x_q,1} \\ s_{y_i,1} \\ s_{y_q,1} \\ s_{x_i,2} \\ s_{x_q,2} \\ s_{y_i,2} \\ s_{y_q,2} \end{bmatrix} = \begin{bmatrix} \delta & 0 & 0 & 0 & f_{15} & f_{16} & 0 & 0 \\ 0 & \delta & 0 & 0 & f_{25} & f_{26} & 0 & 0 \\ 0 & 0 & \delta & 0 & 0 & 0 & f_{37} & f_{38} \\ 0 & 0 & 0 & \delta & 0 & 0 & f_{47} & f_{48} \\ f_{51} & f_{52} & 0 & 0 & \delta & 0 & 0 & 0 \\ f_{61} & f_{62} & 0 & 0 & 0 & \delta & 0 & 0 \\ 0 & 0 & f_{73} & f_{74} & 0 & 0 & \delta & 0 \\ 0 & 0 & f_{83} & f_{84} & 0 & 0 & 0 & \delta \end{bmatrix} \otimes \begin{bmatrix} r_{x_i,1} \\ r_{x_q,1} \\ r_{y_i,1} \\ r_{y_q,1} \\ r_{x_i,2} \\ r_{x_q,2} \\ r_{y_i,2} \\ r_{y_q,2} \end{bmatrix} \quad (41)$$

where $\delta$ denotes the (delayed) impulse function.

The above simplification assumes the following: (1) carrier and phase recovery are achieved previously; (2) the PMD equalizers of both sub-channels have converged on the correct polarizations and without skew between them; and (3) there were no cycle slips (CS) on both sub-channels (similar to the synchronous equalizer case, CS correction is required before the MIMO equalizer). Regarding (2), if the polarization X was exchanged with Y on one of the sub-channels, the output lane of the polarization for one sub channel would depend on the opposite polarization of the opposite sub channel. Further, the filters on the opposite sub-channel but same polarization will have null coefficients. On the other hand, the (symbol) skew between sub-channels may require filters with more taps. These effects (i.e., proper convergence and skew of the sub-channels) can be detected by the Framer block.

Figure 5:
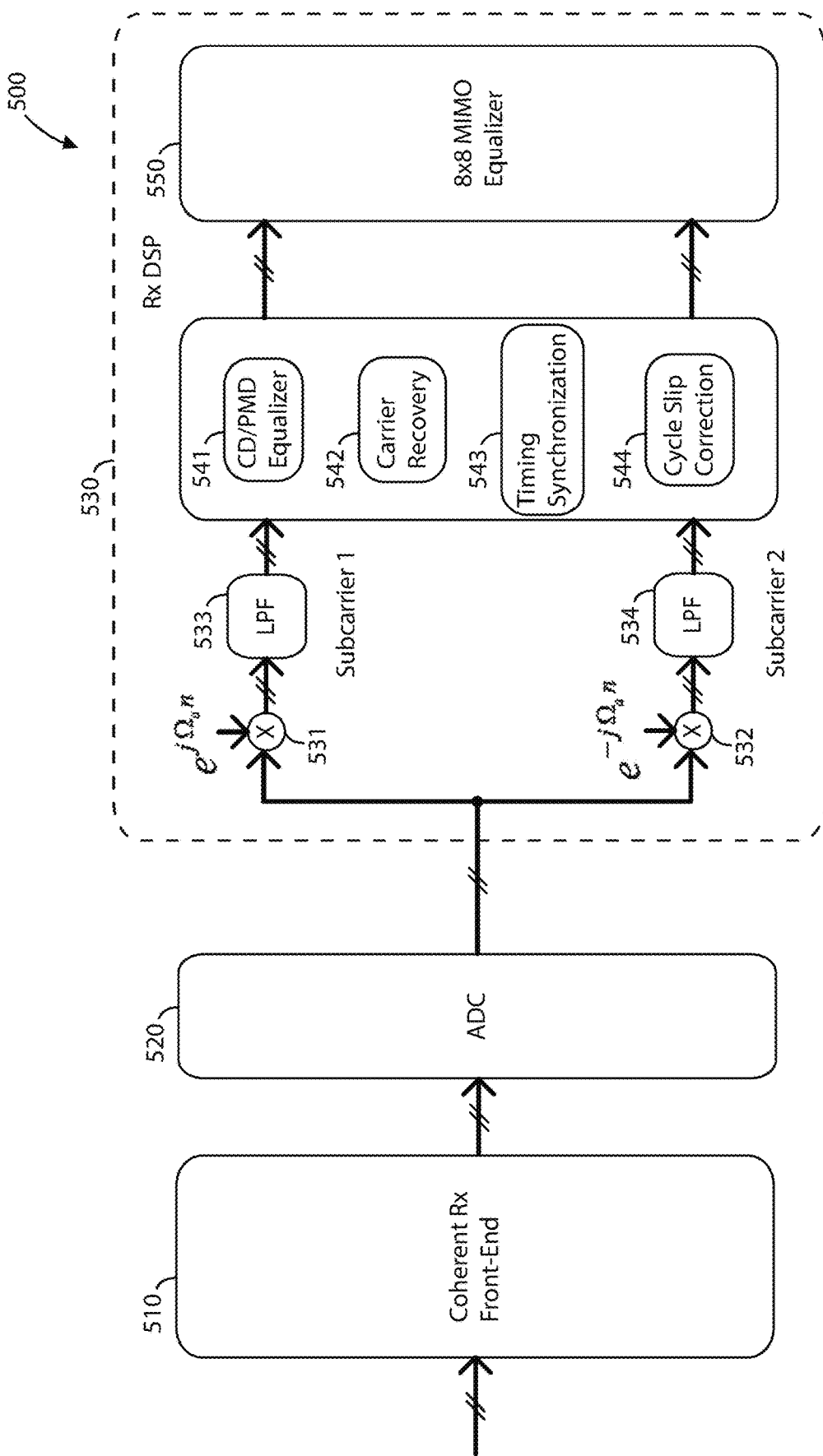
FIG. 5 is a simplified diagram illustrating a coherent optical receiver according to an example of the present invention.

FIG. 5 is a simplified diagram illustrating a coherent optical receiver according to an example of the present invention. As shown, receiver 500 includes a front-end module 510, an analog-to-digital converter (ADC) 520, and a digital signal processor 530. The front-end module 510 is configured to receiving an optical input signal, which is converted to a digital signal by ADC 520. The resulting digital signal is processed within the DSP 530, which includes at least a CD/PMD equalizer 541, a carrier recovery module 542, a timing synchronization module 543, a cycle slip correction module 544, and a reduced complexity 8×8

MIMO equalizer 550. As discussed previously, the reduced complexity 8×8 MIMO equalizer 550 follows at least the processing modules 541-544.

In a specific example, device 500 shows a multi-subcarrier scheme with a first subcarrier and a second subcarrier. Here, both subcarriers are configured together as symmetric channels around the center of the band. Each channel includes a function block 531, 532 ($e^{j\Omega_o n}$, $e^{-j\Omega_o n}$) and a low-pass filter (LPF) 533, 534. These channels connect to the 8×8 MIMO equalizer following the CD/PMD equalization 541, carrier recovery 542, timing synchronization 543, and cycle slip correction blocks 544. This scheme can be expanded to incorporate more subcarriers in which pairs subcarriers are configured in symmetric channels around the center of the band. An 8×8 MIMO equalizer can be configured to each pair of symmetric subcarrier channels. Those of ordinary skill in the art will recognize other variations, modifications, and alternatives.

In an example, the present invention provides a multi-subcarrier coherent optical receiver device. The device includes a front-end module configured to receive an input signal; an analog-to-digital converter (ADC) electrically coupled to the front-end module; and a digital signal processor (DSP) electrically coupled to the ADC. The DSP can includes a polarization-mode dispersion (PMD) equalizer module, a carrier recovery module, a cycle slip correction module, a timing synchronization module; and a reduced complexity 8×8 MIMO (Multiple-Input, Multiple-Output) equalizer. This equalizer is configured such that each of the 8 outputs is electrically coupled to 3 of the 8 inputs, wherein each of the input-output couplings is configured as a filter. In a specific example, the reduced complexity equalizer architecture is characterized by 24 digital filters. In a specific example, 1 of the 3 output-input couplings of each of the 8 outputs in the 8×8 MIMO equalizer consists of 1 tap (resulting in the equalizer being characterized by 16 digital filters). Of course, there can be other variations, modifications, and alternatives.

In an example, the present invention provides a method of impairment compensation in a coherent optical receiver device. The method includes receiving, by a front-end module, an optical input signal; converting, by an analog-to-digital converter (ADC) electrically coupled to the front-end module, the optical input signal to a digital input signal; and processing, by a digital signal processor (DSP) electrically coupled to the ADC, the digital input signal. The method also includes compensating, by an 8×8 MIMO equalizer within the DSP configured such that each of the 8 outputs is electrically coupled to 3 of the 8 inputs, wherein each of the input-output couplings is configured as a filter, the digital input signal. The processing by the DSP can also include processing via the PMD equalizer module, the carrier recovery module, the cycle slip correction module, and the timing synchronization module. Other variations, modifications, and alternatives will be recognized by those of ordinary skill in the art.

V. Numerical Results for the Skew Compensator

Examples of the present I/Q compensator were implemented and simulated on a floating-point simulator, implementing both the full filters mode (50) and the simplified mode (51). The following figures show the penalty versus the I/Q skew introduced on the transmitter side. The channel is a non-dispersive optical channel with ASE noise and a frequency rotation of the state polarizations of 5 kHz. Also, the receiver laser has a frequency offset of 200 MHz with respect to the transmitter laser. The MIMO equalizer convergence starts once all the other DSP modules have converged. We use N=21 taps on each filter of the MIMO equalizer.

Figure 6:
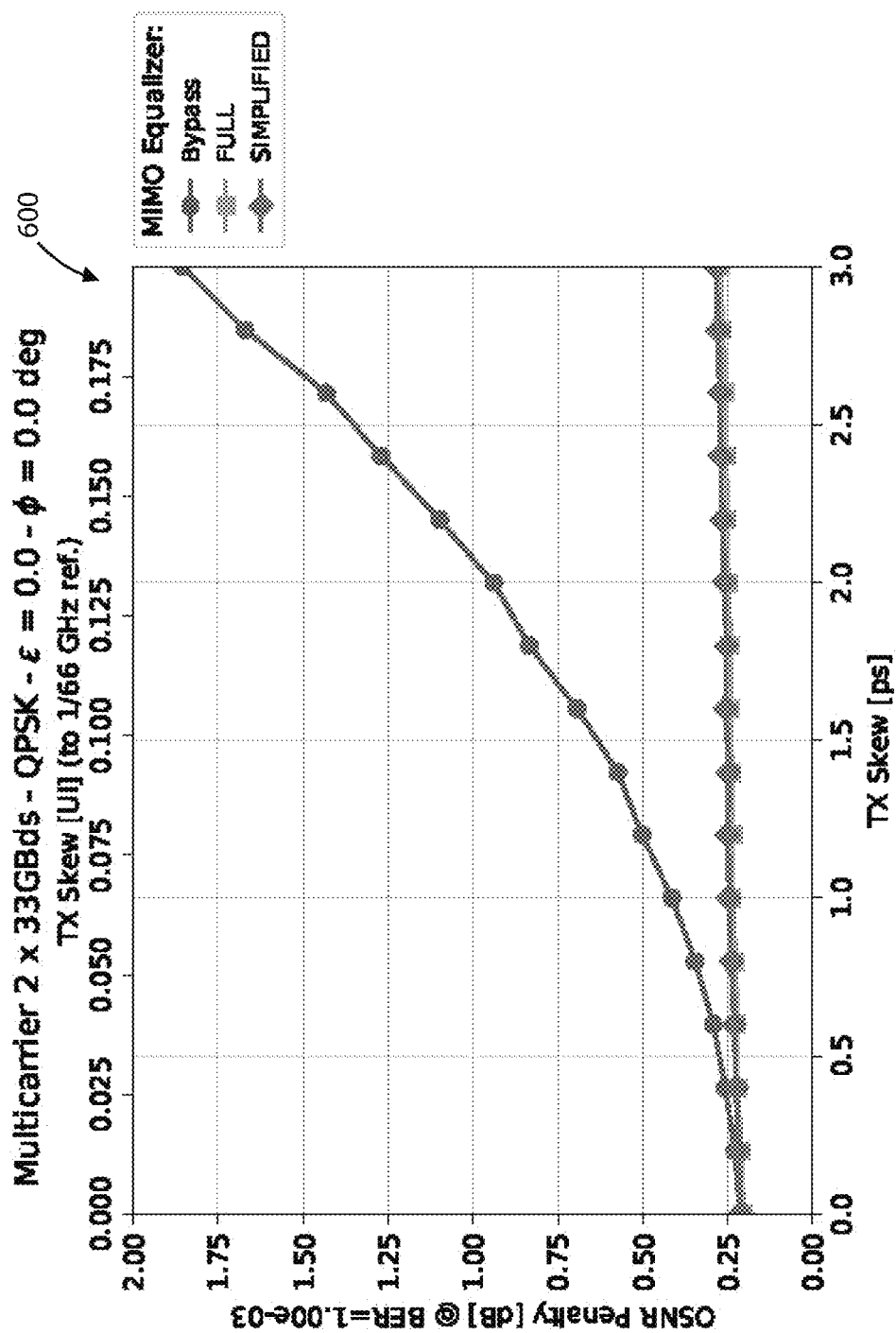
FIG. 6 is a sample graph illustrating simulation results for QPSK with $\epsilon=0$ and $\phi=0$ according to an example of the present invention.
Figure 7:
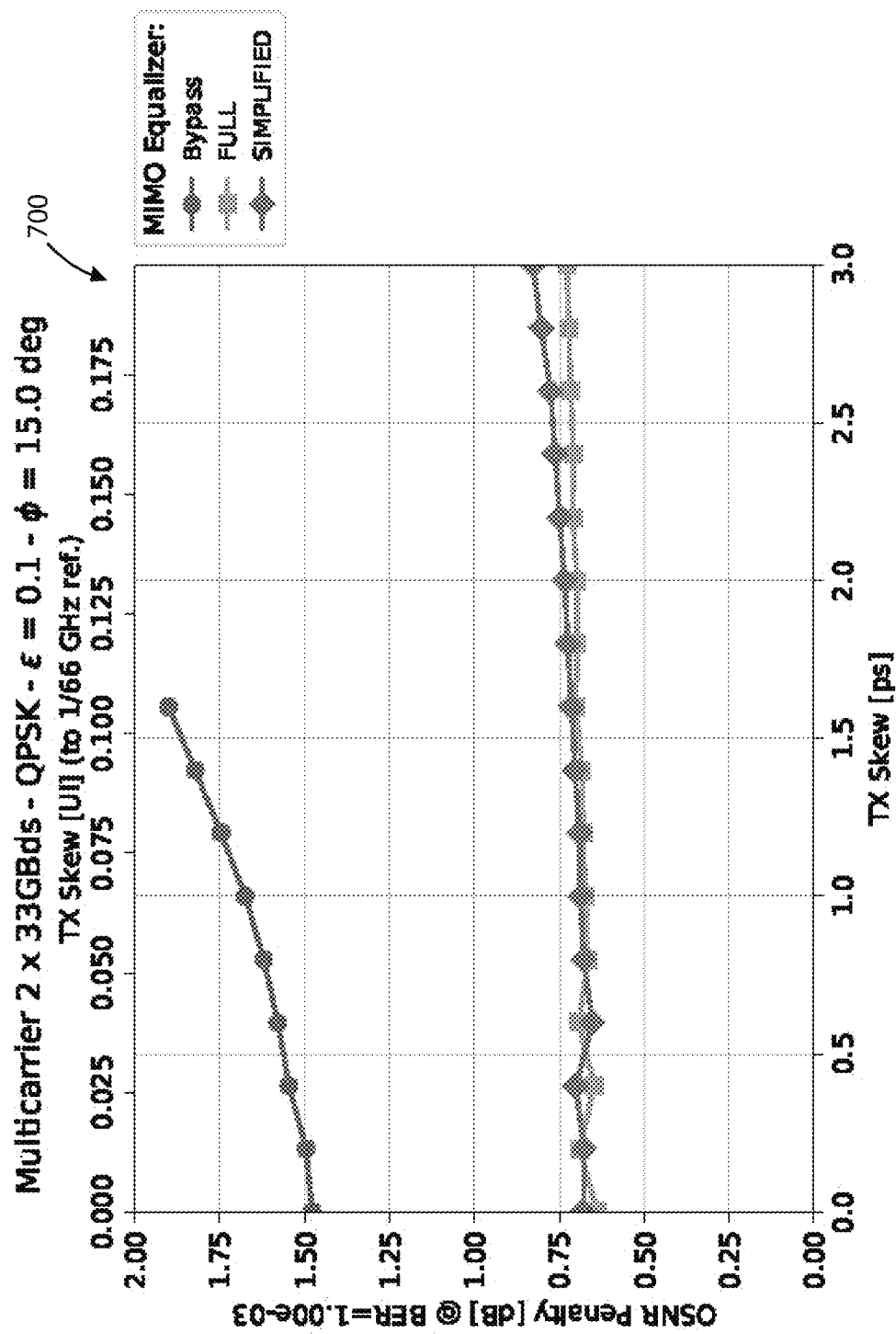
FIG. 7 is a sample graph illustrating simulation results for QPSK with $\epsilon=0.1$ and $\phi=15°$ according to an example of the present invention.
Figure 8:
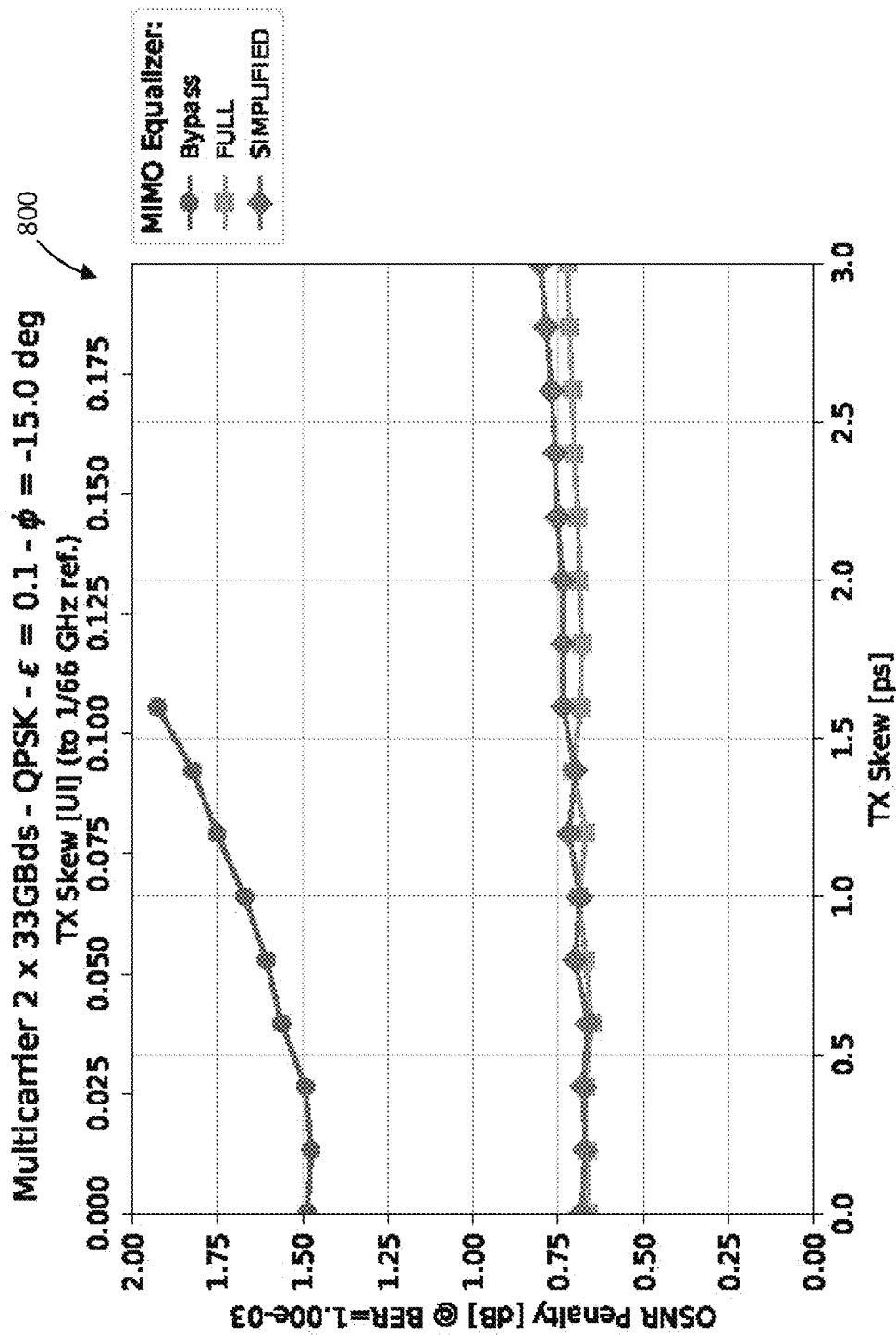
FIG. 8 is a sample graph illustrating simulation results for QPSK with $\epsilon=0.1$ and $\phi=-15°$ according to an example of the present invention.

FIGS. 6-8 show sample graphs illustrating simulation results for QPSK. FIG. 6 shows sample graph 600 with $\epsilon=0$ and $\phi=0$. FIG. 7 shows sample graph 700 with $\epsilon=0.1$ and $\phi=15°$. And FIG. 8 shows sample graph 800 with $\epsilon=0.1$ and $\phi=-15°$.

Figure 9:
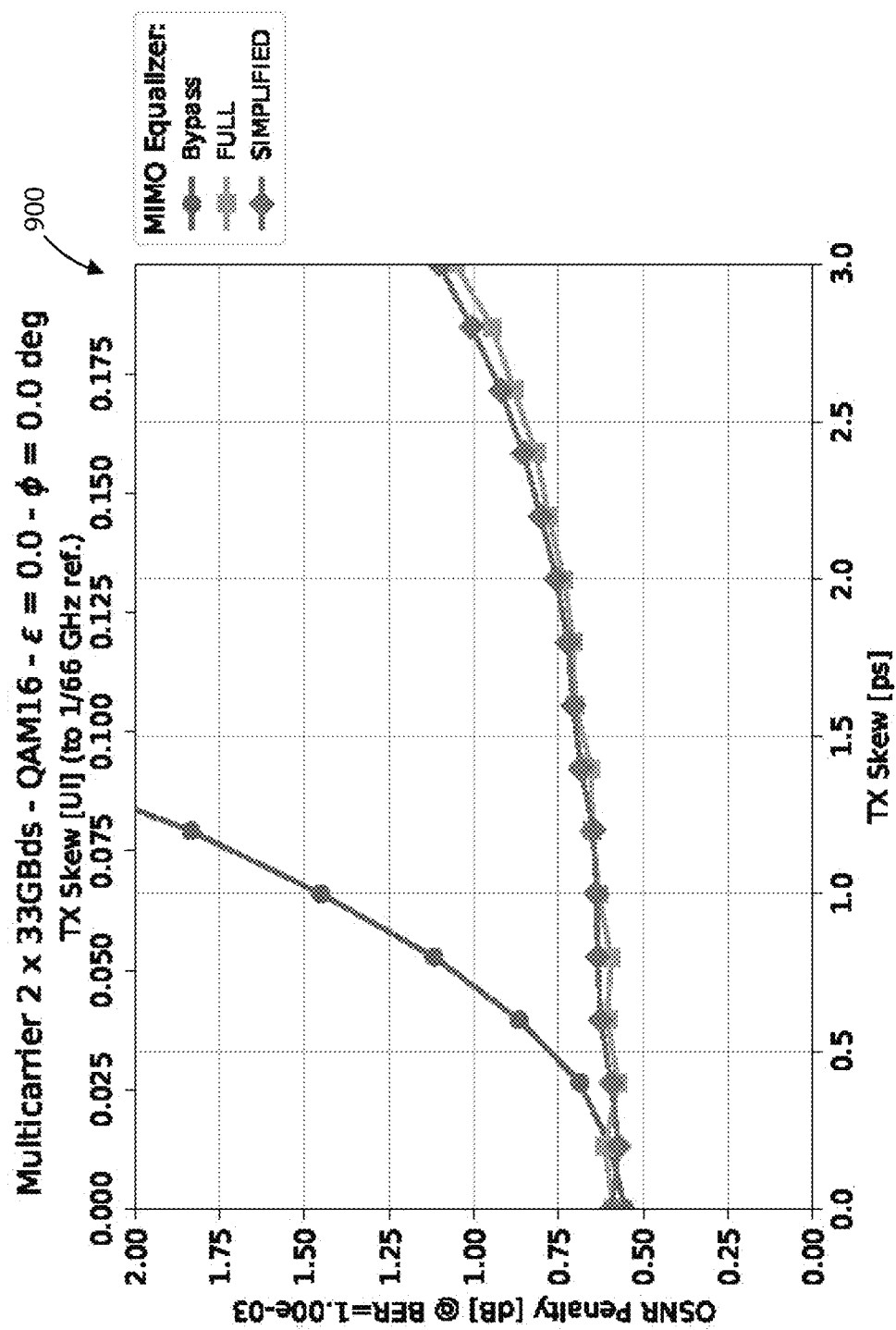
FIG. 9 is a sample graph illustrating simulation results for QAM16 with $\epsilon=0$ and $\phi=0$ according to an example of the present invention.
Figure 10:
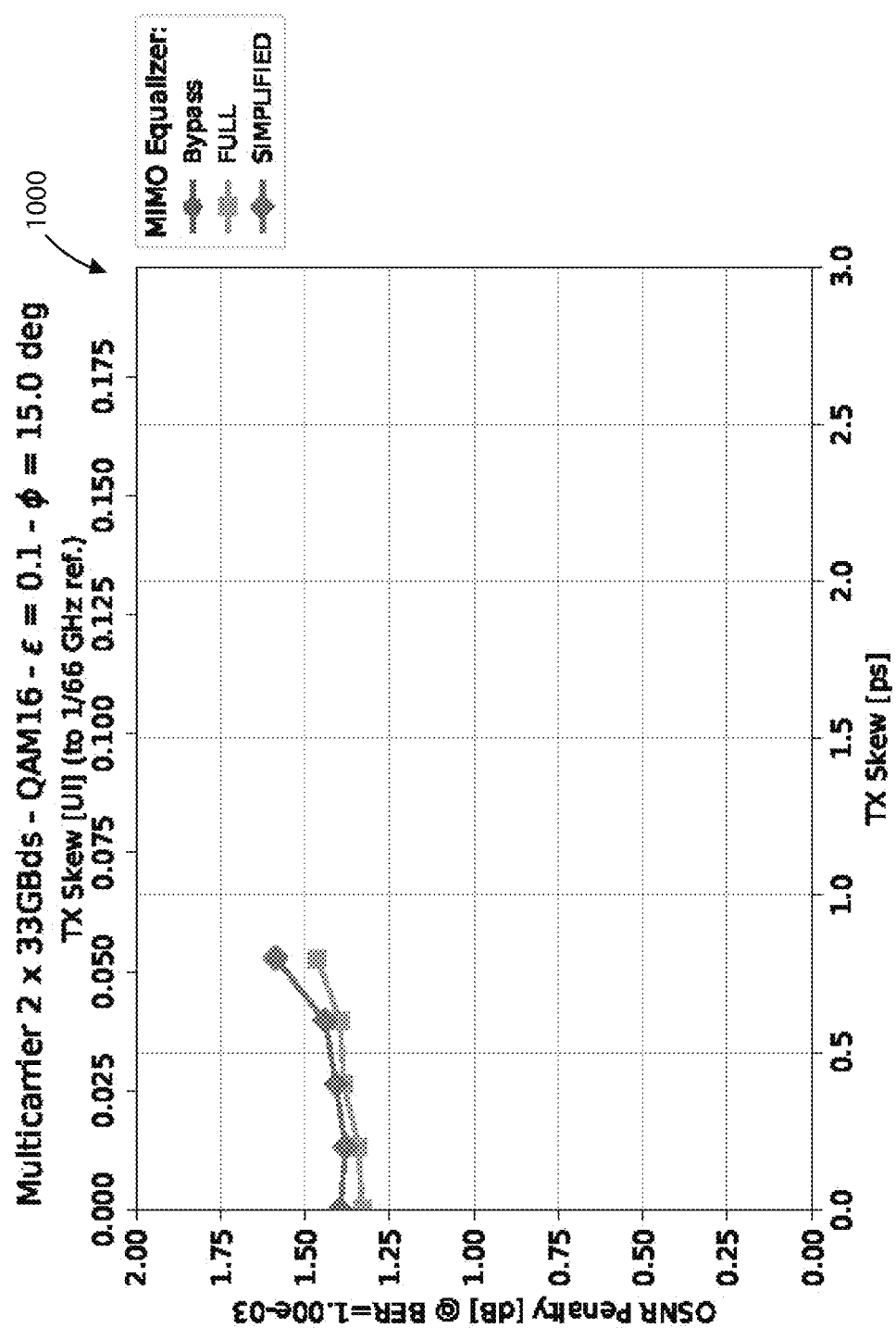
FIG. 10 is a sample graph illustrating simulation results for QAM16 with $\epsilon=0.1$ and $\phi=15°$ according to an example of the present invention.
Figure 11:
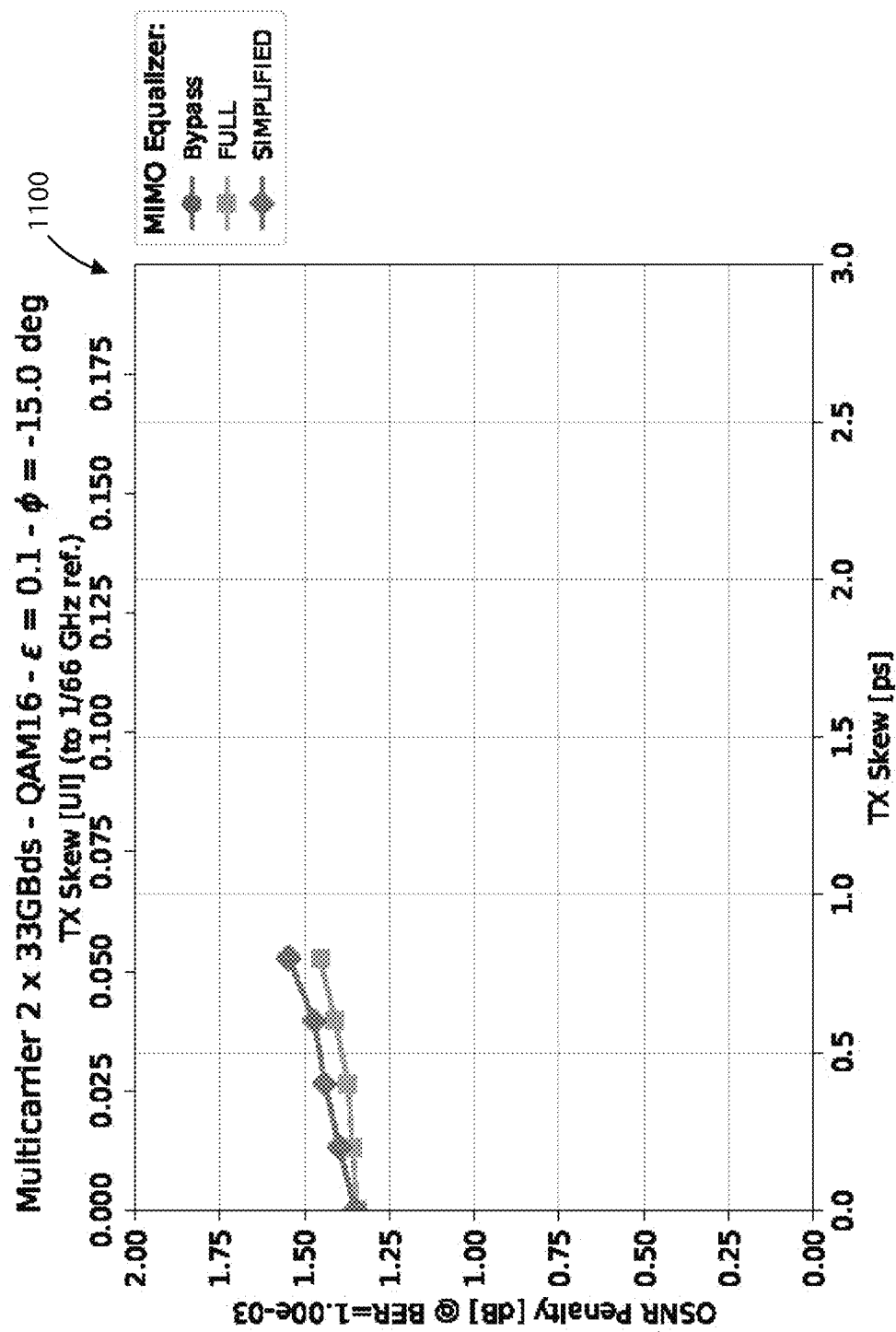
FIG. 11 is a sample graph illustrating simulation results for QAM16 with $\epsilon=0.1$ and $\phi=-15°$ according to an example of the present invention.

FIGS. 9-11 show sample graphs illustrating simulation results for QAM16. FIG. 9 shows sample graph 900 with $\epsilon=0$ and $\phi=0$. FIG. 10 shows sample graph 1000 with $\epsilon=0.1$ and $\phi=15°$. FIG. 11 shows sample graph 1100 with $\epsilon=0.1$ and $\phi=-15°$.

Both uncompensated and compensated receivers (full and simplified compensators included) are compared in these results. Firstly, only TX I/Q skew is introduced, and then quadrature error is added with amplitude imbalance of $\epsilon=0.1$ and phase errors of $\phi=\pm15°$. In the absence of I/Q skew ($\tau=0$), SNR penalty after the optimal compensator for 68 $=0.1$ and $|\phi|=15°$ will be (at least) as follows:

$$10\log_{10}(F) = 10\log_{10}\left[\frac{1+\epsilon^2}{(1+\epsilon^2)^2\cos^2(\phi)}\right] = 0.43 \text{ dB}$$

QPSK and QAM16 are simulated with two subcarrier channels of 33 GBd, making an aggregate symbol rate of 66 GBd. It can be seen that QAM16 is less robust than QPSK. In QAM 16, the DSP cannot converge without the compensator of I/Q skew and quadrature errors. In all of these cases, the proposed reduced complexity compensator achieves improved performance.

Figure 12A:
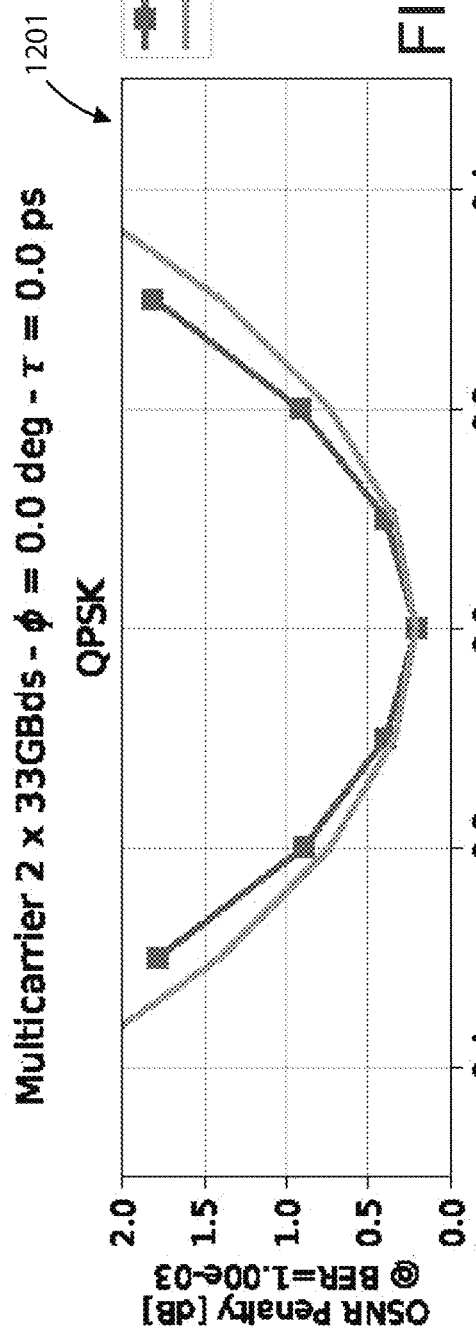
FIGS. 12A-12B are sample graphs illustrating SNR penalty versus phase error and amplitude error, respectively, for QPSK according to an example of the present invention.
Figure 12B:
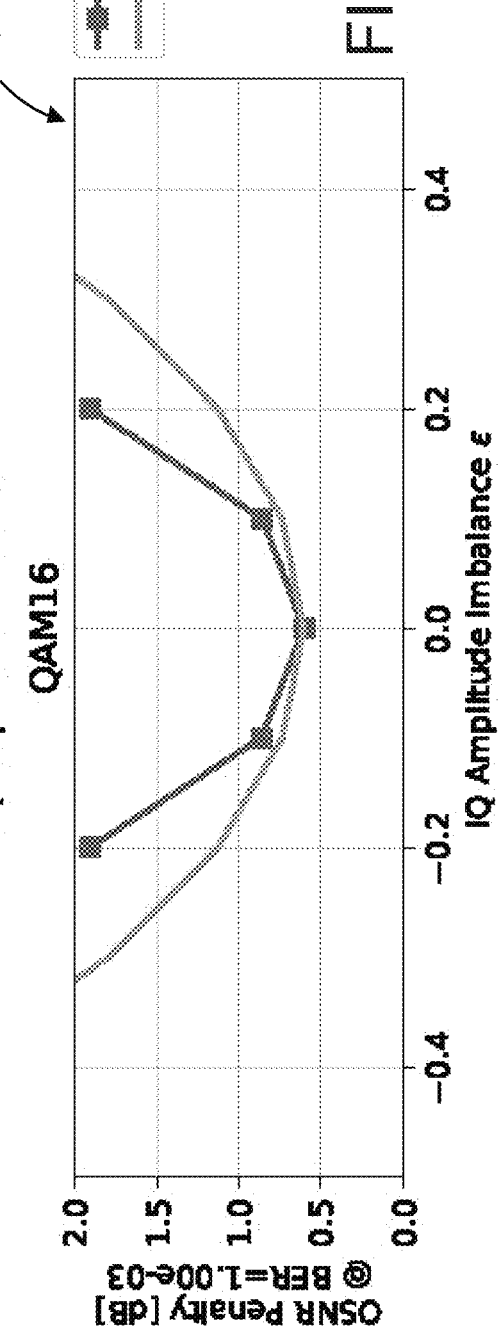
Figure 13A:
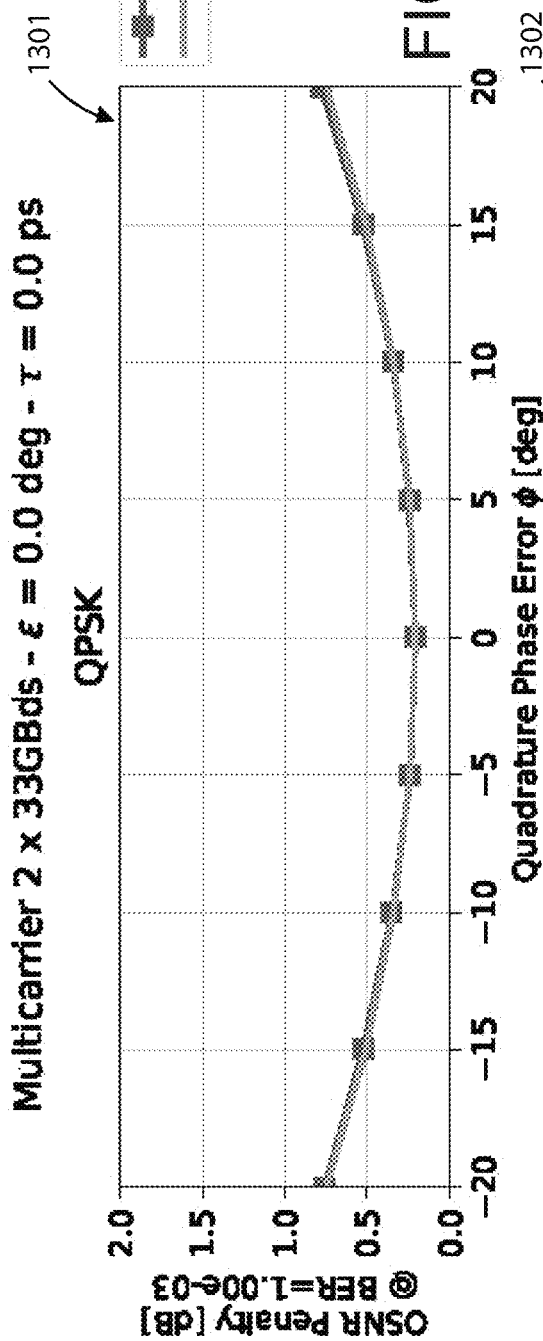
FIGS. 13A-13B are sample graphs illustrating SNR penalty versus phase error and amplitude error, respectively, for QAM16 according to an example of the present invention
Figure 13B:
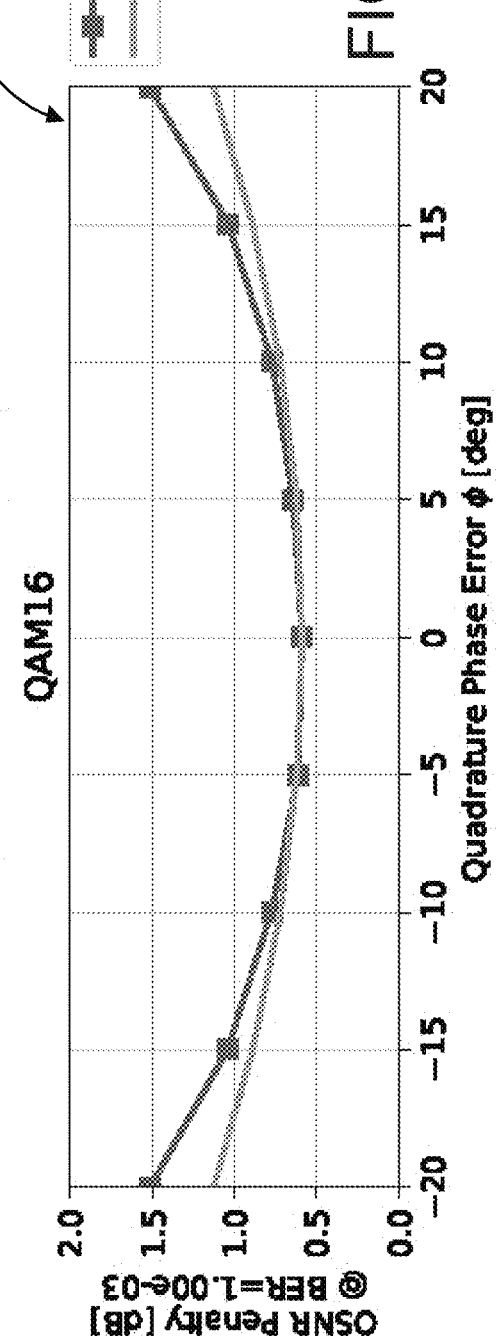

FIGS. 12A-12B and 13A-13B show the SNR penalty versus phase and gain imbalances with $\tau=0$. FIG. 12A is a sample graph illustrating SNR versus the amplitude error E for QPSK, while FIG. 12B illustrates the same for QAM16. Similarly, FIG. 13A is a sample graph illustrating SNR versus the phase error $\phi$ for QPSK, while FIG. 13B illustrates the same for QAM16. For QPSK, it is observed that the simulations agree very well with the theoretical values derived from Equation (34). The accuracy of (34) degrades with QAM16 as a result of the impact of the quadrature errors on the other DSP algorithms (e.g., carrier recovery, PMD equalizer, etc.).

Figure 14:
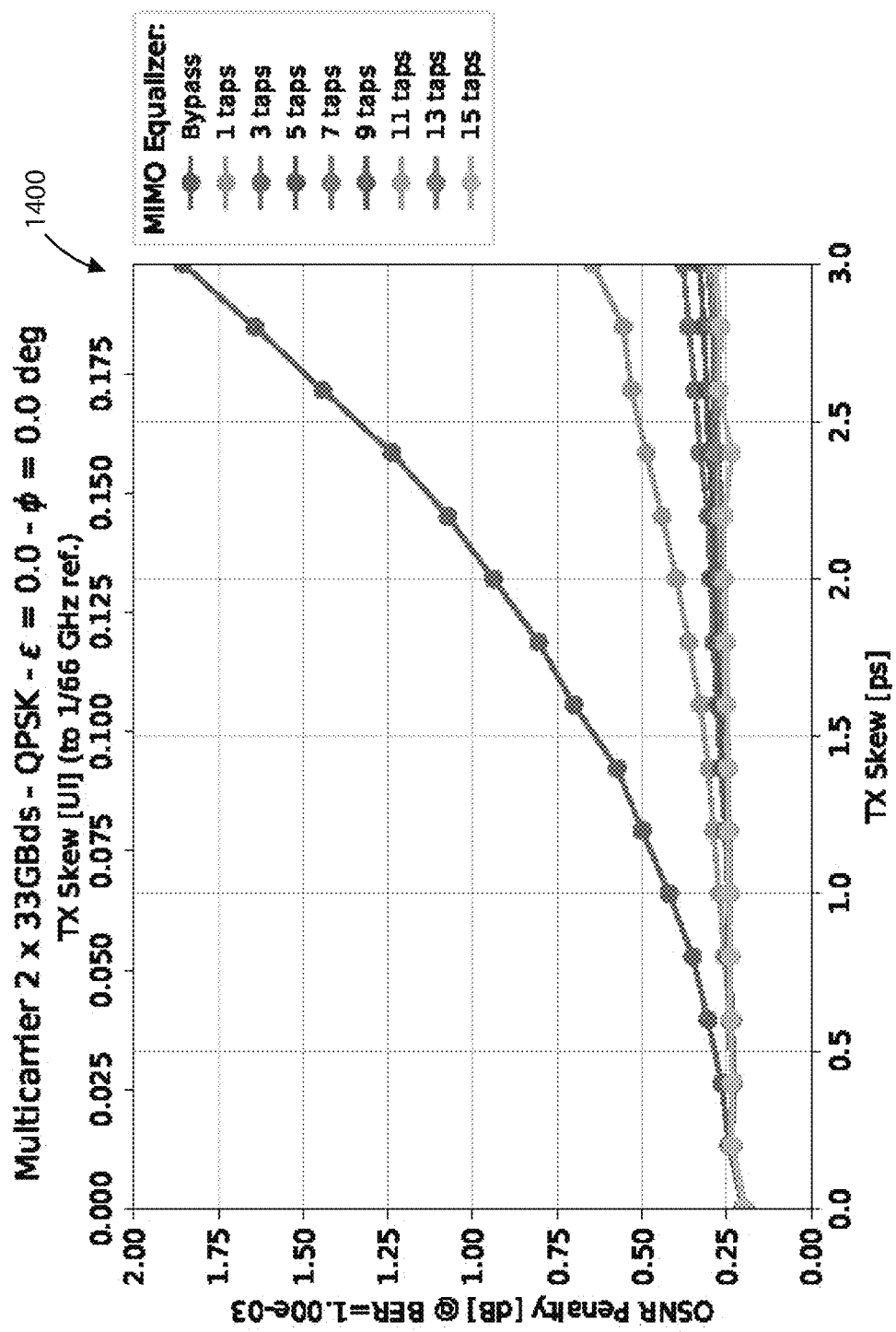
FIG. 14 is a sample graph illustrating simulation results using different numbers of taps in the equalizers for QPSK according to examples of the present invention.
Figure 15:
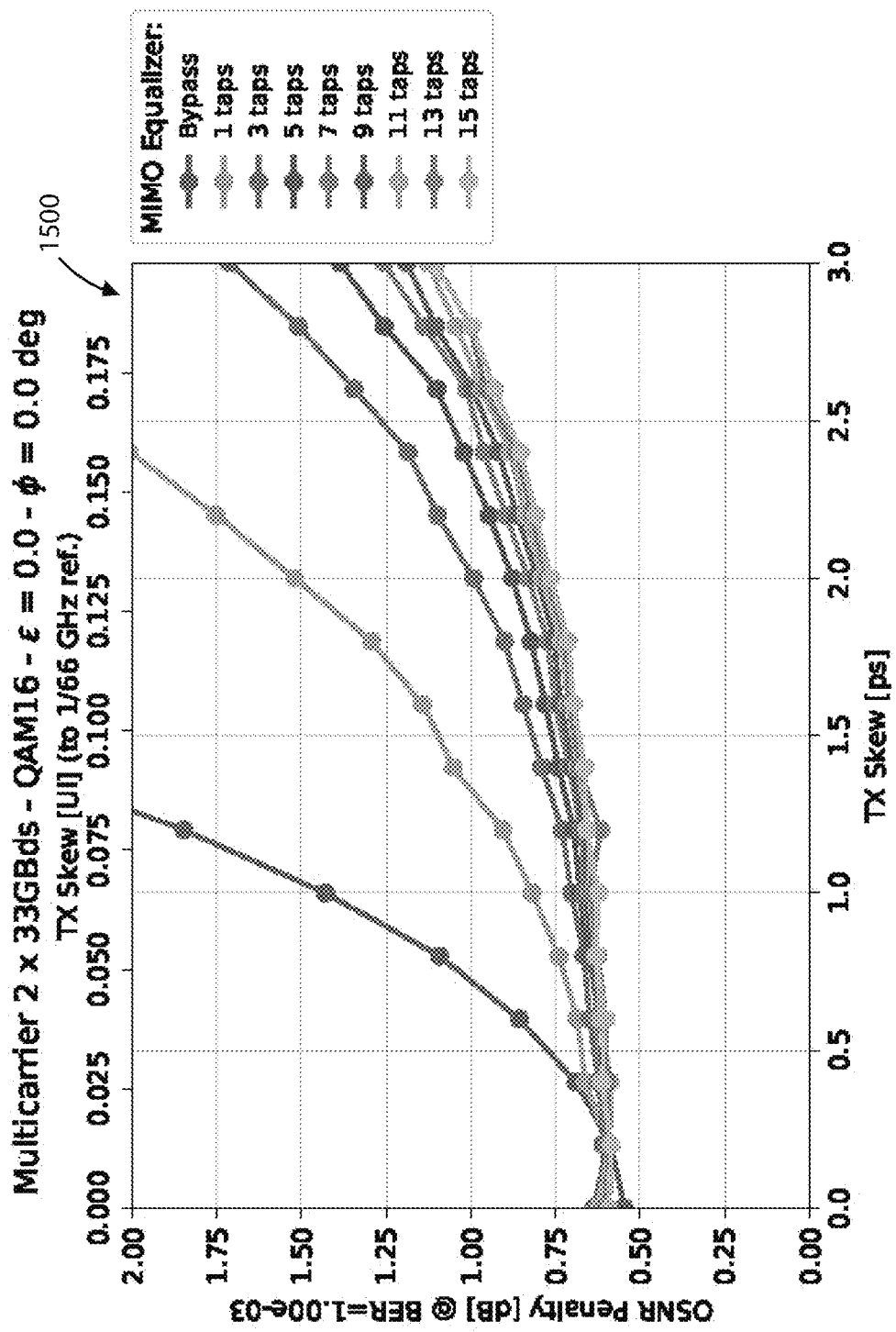
FIG. 15 is a sample graph illustrating simulation results using different numbers of taps in the equalizers for QAM16 according to examples of the present invention.

Finally, FIGS. 14 and 15 show performance comparisons by using different numbers of taps in the equalizers. Graph 1400 shows the results for QPSK, while graph 1500 shows the results for QAM16. In a specific example, an equalizer with N=7 taps exhibits satisfactory performance for the cases considered. These results reinforce that the present reduced complexity I/Q compensation approach in equalizer devices will provide improved performance by reducing I/Q skew with low impact on power consumption.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A digital signal processor (DSP) device, the device comprising:
   a first subcarrier path configured to receive an input signal and to output a first plurality of component baseband signals;

a second subcarrier path configured to receive the input signal and to output a second plurality of component baseband signals; and a MIMO (Multiple Input, Multiple Output) equalizer electrically coupled to the first subcarrier path and the second subcarrier path, the MIMO equalizer being configured to receive the first plurality of component baseband signals and the second plurality of component baseband signals;

wherein the MIMO equalizer is characterized by a filter operation resulting in a plurality of outputs, wherein each of the plurality of outputs is characterized by a filter function that is only dependent on a subset of the first and second pluralities of component baseband signals.

2. The device of claim 1 further comprising a first function block coupled to a first low-pass filter configured on the first subcarrier path, and second function block coupled to a second low-pass filter configured on the second subcarrier path.

3. The device of claim 1 wherein the MIMO equalizer is configured to operate at symbol rate.

4. The device of claim 1 further comprising a chromatic dispersion (CD)/polarization-mode dispersion (PMD) equalizer module configured to perform CD and PMD equalization on the first and second pluralities of component baseband signals;

a carrier recovery module configured to perform carrier and phase recovery on the first and second pluralities of component baseband signals;

a timing synchronization module configured to perform timing synchronization on the first and second pluralities of component baseband signals; and a cycle slip correction module configured to perform cycle slip correction on the first and second pluralities of component baseband signals;

wherein the MIMO equalizer is configured to receive the first and second pluralities of component baseband signals following the CD/PMD equalizer module, the carrier recovery module, the timing synchronization module, and the cycle slip correction module.

5. The device of claim 1 wherein the first subcarrier path and the second subcarrier path are configured as symmetric channels.

6. The device of claim 1 wherein the MIMO equalizer is characterized by the following operation:

$$\begin{bmatrix} s_{x_i,1} \\ s_{x_q,1} \\ s_{y_i,1} \\ s_{y_q,1} \\ s_{x_i,2} \\ s_{x_q,2} \\ s_{y_i,2} \\ s_{y_q,2} \end{bmatrix} = \begin{bmatrix} \delta & 0 & 0 & 0 & f_{15} & f_{16} & 0 & 0 \\ 0 & \delta & 0 & 0 & f_{25} & f_{26} & 0 & 0 \\ 0 & 0 & \delta & 0 & 0 & 0 & f_{37} & f_{38} \\ 0 & 0 & 0 & \delta & 0 & 0 & f_{47} & f_{48} \\ f_{51} & f_{52} & 0 & 0 & \delta & 0 & 0 & 0 \\ f_{61} & f_{62} & 0 & 0 & 0 & \delta & 0 & 0 \\ 0 & 0 & f_{73} & f_{74} & 0 & 0 & \delta & 0 \\ 0 & 0 & f_{83} & f_{84} & 0 & 0 & 0 & \delta \end{bmatrix} \otimes \begin{bmatrix} r_{x_i,1} \\ r_{x_q,1} \\ r_{y_i,1} \\ r_{y_q,1} \\ r_{x_i,2} \\ r_{x_q,2} \\ r_{y_i,2} \\ r_{y_q,2} \end{bmatrix}$$

where $\otimes$ denotes sum of convolution, $f_{ij}$ is an impulse response of the equalizer corresponding to an i-th output due to a j-th input, where $\delta$ denotes a delayed impulse function, $s_x$ and $s_y$ are the component baseband signals for a first subcarrier and a second subcarrier, and $r_x$ and $r_y$ are component baud-rate samples for the first subcarrier and the second subcarrier.

7. A multi-subcarrier coherent optical receiver device, the device comprising:

a front-end module configured to receive an input signal;

an analog-to-digital converter (ADC) electrically coupled to the front-end module and configured to convert the input signal to a digital input signal; and a digital signal processor (DSP) electrically coupled to the ADC and configured to receive the digital input signal, wherein the DSP comprises:

a first subcarrier path configured to receive the digital input signal and to output a first plurality of component baseband signals;

a second subcarrier path configured to receive the digital input signal and to output a second plurality of component baseband signals;

a chromatic dispersion (CD)/polarization-mode dispersion (PMD) equalizer module configured to perform CD and PMD equalization on the first and second pluralities of component baseband signals;

a carrier recovery module configured to perform carrier and phase recovery on the first and second pluralities of component baseband signals;

a timing synchronization module configured to perform timing synchronization on the first and second pluralities of component baseband signals;

a cycle slip correction module configured to perform cycle slip correction on the first and second pluralities of component baseband signals; and a MIMO (Multiple-Input, Multiple-Output) equalizer being configured to receive the first plurality of component baseband signals and the second plurality of component baseband signal following the CD/PMD equalizer module, the carrier recovery module, the timing synchronization module, and the cycle slip correction module, wherein the MIMO equalizer is characterized by a filter operation resulting in a plurality of outputs, wherein each of the plurality of outputs is characterized by a filter function that is only dependent on a subset of the first and second pluralities of component baseband signals.

8. The device of claim 7 further comprising a first function block coupled to a first low-pass filter configured on the first subcarrier path, and second function block coupled to a second low-pass filter configured on the second subcarrier path.

9. The device of claim 7 wherein the MIMO equalizer is configured to operate at symbol rate.

10. The device of claim 7 wherein the first subcarrier path and the second subcarrier path are configured as symmetric channels.

11. The device of claim 7 wherein the MIMO equalizer is characterized by the following operation:

$$\begin{bmatrix} s_{x_i,1} \\ s_{x_q,1} \\ s_{y_i,1} \\ s_{y_q,1} \\ s_{x_i,2} \\ s_{x_q,2} \\ s_{y_i,2} \\ s_{y_q,2} \end{bmatrix} = \begin{bmatrix} \delta & 0 & 0 & 0 & f_{15} & f_{16} & 0 & 0 \\ 0 & \delta & 0 & 0 & f_{25} & f_{26} & 0 & 0 \\ 0 & 0 & \delta & 0 & 0 & 0 & f_{37} & f_{38} \\ 0 & 0 & 0 & \delta & 0 & 0 & f_{47} & f_{48} \\ f_{51} & f_{52} & 0 & 0 & \delta & 0 & 0 & 0 \\ f_{61} & f_{62} & 0 & 0 & 0 & \delta & 0 & 0 \\ 0 & 0 & f_{73} & f_{74} & 0 & 0 & \delta & 0 \\ 0 & 0 & f_{83} & f_{84} & 0 & 0 & 0 & \delta \end{bmatrix} \otimes \begin{bmatrix} r_{x_i,1} \\ r_{x_q,1} \\ r_{y_i,1} \\ r_{y_q,1} \\ r_{x_i,2} \\ r_{x_q,2} \\ r_{y_i,2} \\ r_{y_q,2} \end{bmatrix}$$

where ⊗ denotes sum of convolution, $f_{ij}$ is an impulse response of the equalizer corresponding to an i-th output due to a j-th input, where δ denotes a delayed impulse function, $s_x$ and $s_y$ are component baseband signals for the first subcarrier and the second subcarrier, and $r_x$ and $r_y$ are component baud-rate samples for the first subcarrier and the second subcarrier.

12. A method of impairment compensation in a multi-subcarrier coherent optical receiver device having a digital signal processor (DSP), the method comprising:
   providing, through a first subcarrier path of the DSP, a first plurality of component baseband signals;
   providing, through a second subcarrier path of the DSP, a second plurality of component baseband signals;
   compensating, by a MIMO (Multiple Input, Multiple Output) equalizer within the DSP, the first and second pluralities of component baseband signals using a filter operation resulting in a plurality of outputs, wherein each of the plurality of outputs is characterized by a filter function that is only dependent on a subset of the first and second pluralities of component baseband signals.

13. The method of claim 12 further comprising
   receiving, by a front-end module of the multi-subcarrier coherent optical receiver device, an input signal; and
   converting, by an analog-to-digital converter (ADC) of the multi-subcarrier coherent optical receiver device, the input signal to a digital input signal;
   wherein providing the first plurality of component baseband signals includes receiving, by the first subcarrier path, the digital input signal and outputting, by the first subcarrier path, the first plurality of component baseband signals; and
   wherein providing the second plurality of component baseband signals includes receiving, by the second subcarrier path, the digital input signal and outputting, by the second subcarrier path, the second plurality of component baseband signals.

14. The method of claim 13 wherein outputting the first plurality of component baseband signals includes
   processing, by a first function block on the first subcarrier path, the first plurality of component baseband signals, and
   filtering, by a first low-pass filter on the first subcarrier path, the first plurality of component baseband signals; and
   wherein outputting the second plurality of component baseband signals includes
   processing, by a second function block on the second subcarrier path, the second plurality of component baseband signals, and
   filtering, by a second low-pass filter on the second subcarrier path, the second plurality of component baseband signals.

15. The method of claim 12 further comprising
   performing, by a chromatic dispersion (CD)/polarization-mode dispersion (PMD) equalizer, CD and PMD equalization on the first and second pluralities of component baseband signals;
   performing, by a carrier recovery module, carrier and phase recovery on the first and second pluralities of component baseband signals;
   performing, by a timing synchronization module, timing synchronization on the first and second pluralities of component baseband signals; and
   performing, by a cycle slip correction module, cycle clip correction on the first and second pluralities of component baseband signals;
   wherein compensating, by the MIMO, the first and second pluralities of component baseband signals is performed following the performing of the CD and PMD equalization, the carrier and phase recovery, the timing synchronization, and the cycle slip correction.

16. The method of claim 12 wherein the first subcarrier path and the second subcarrier path are configured as symmetric channels.

17. The method of claim 12 wherein the MIMO equalizer is configured to operate at symbol rate.

18. The method of claim 12 wherein the MIMO equalizer is characterized by the following operation:

$$\begin{bmatrix} s_{x_i,1} \\ s_{x_q,1} \\ s_{y_i,1} \\ s_{y_q,1} \\ s_{x_i,2} \\ s_{x_q,2} \\ s_{y_i,2} \\ s_{y_q,2} \end{bmatrix} = \begin{bmatrix} \delta & 0 & 0 & 0 & f_{15} & f_{16} & 0 & 0 \\ 0 & \delta & 0 & 0 & f_{25} & f_{26} & 0 & 0 \\ 0 & 0 & \delta & 0 & 0 & 0 & f_{37} & f_{38} \\ 0 & 0 & 0 & \delta & 0 & 0 & f_{47} & f_{48} \\ f_{51} & f_{52} & 0 & 0 & \delta & 0 & 0 & 0 \\ f_{61} & f_{62} & 0 & 0 & 0 & \delta & 0 & 0 \\ 0 & 0 & f_{73} & f_{74} & 0 & 0 & \delta & 0 \\ 0 & 0 & f_{83} & f_{84} & 0 & 0 & 0 & \delta \end{bmatrix} \otimes \begin{bmatrix} r_{x_i,1} \\ r_{x_q,1} \\ r_{y_i,1} \\ r_{y_q,1} \\ r_{x_i,2} \\ r_{x_q,2} \\ r_{y_i,2} \\ r_{y_q,2} \end{bmatrix}$$

where ⊗ denotes sum of convolution, $f_{ij}$ is an impulse response of the equalizer corresponding to an i-th output due to a j-th input, where δ denotes a delayed impulse function, $s_x$ and $s_y$ are component baseband signals for the first subcarrier and the second subcarrier, and $r_x$ and $r_y$ are component baud-rate samples for the first subcarrier and the second subcarrier.

* * * * *